United States Patent
Kumar et al.

(10) Patent No.: US 7,050,343 B2
(45) Date of Patent: May 23, 2006

(54) BUILT-IN TESTING METHODOLOGY IN FLASH MEMORY

(75) Inventors: Promod Kumar, Motta S. Anastasia (IT); Francesco Tomaiuolo, Monte Sant'Angelo (IT); Pierpaolo Nicosia, Catania (IT); Luca Giuseppe De Ambroggi, Catania (IT); Francesco Pipitone, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 51 days.

(21) Appl. No.: 10/789,443

(22) Filed: Feb. 27, 2004

(65) Prior Publication Data

US 2004/0218440 A1    Nov. 4, 2004

(30) Foreign Application Priority Data

Feb. 27, 2003  (EP)  .................................. 03425126

(51) Int. Cl.
*G11C 29/00*    (2006.01)

(52) U.S. Cl. ............. 365/201; 365/185.01; 365/185.33
(58) Field of Classification Search ................ 365/201, 365/200, 185.01, 185.33
See application file for complete search history.

(56) References Cited

U.S. PATENT DOCUMENTS

| | | | |
|---|---|---|---|
| 5,058,068 A | 10/1991 | Costabello | 365/200 |
| 5,633,877 A | 5/1997 | Shephard, III et al. | 371/22.2 |
| 5,732,207 A | 3/1998 | Allen et al. | 395/182.03 |
| 6,813,183 B1 * | 11/2004 | Chevallier | 365/185.09 |
| 2001/0004326 A1 | 6/2001 | Terasaki et al. | 365/185.23 |
| 2001/0016897 A1 | 8/2001 | Bates, Jr. et al. | 711/137 |
| 2001/0019499 A1 | 9/2001 | Ishibashi et al. | 365/182 |

FOREIGN PATENT DOCUMENTS

GB    1158010    7/1969

* cited by examiner

*Primary Examiner*—Van Thu Nguyen
*Assistant Examiner*—Pho M. Luu
(74) *Attorney, Agent, or Firm*—Lisa K. Jorgenson; Allen, Dyer, Dopppelt, Milbrath & Gilchrist, P.A.

(57) ABSTRACT

An Electric Wafer Sort (EWS) flow is implemented by expanding the functions of the micro-controller embedded in a FLASH EPROM memory device and of the integrated test structures. Test routines are executed by the onboard microcontrollers (that may be reading either from an embedded ROM or from a GLOBAL CACHE provided) internally without involving any external complex or expensive test equipment to control the test program. The device architecture is transparent from a tester point of view, with a standard interface having a set of defined commands and instructions to be interpreted by the on board microcontroller and internally executed.

11 Claims, 26 Drawing Sheets

BUILT-IN TESTING METHODOLOGY IN FLASH MEMORY

FIELD OF THE INVENTION

This invention relates in general to the fabrication of integrated digital devices and in particular to the techniques of quality testing, configuration, repair and validation of memory devices that are carried out at wafer level during the fabrication process.

BACKGROUND OF THE INVENTION

For enhancing quality standards and productivity in the semiconductor industry, not only implementation of improved technologies resulting from research and development efforts but also unrelated efforts in the areas of design, validation and engineering that may ensure a good test coverage in the shortest time are needed to meet time to market targets and reduce costs. The speeding up of the industrialization phase and optimizing test strategy for timely achieving validation and qualification of devices involves several factors such as the choice of the testing platform and of the level of test coverage, built-in self-tests, device settings and repair techniques. To achieve the most effective results the best compromise must be made between added costs in terms of silicon area, HW/SW development time and relative costs, testing time and test coverage.

Regarding testing of Flash Memory Devices, fundamental testing phases in a Flash Memory fabrication process are described below. Electric Wafer Sort (EWS) is an electrical test performed on each device at wafer level. During this test, parametric measurements and functionality checks are executed to validate reliability. Moreover the setting of internal registers and trimming of internal references (Reference Cells for the write and read operations, voltage and current internal reference: Bgap, Iref) is performed to enhance performance, considering possible deviation of parameters due to the process stability (process spreads). During this testing flow it is possible to detect and substitute the fail locations of the memory array with spare array elements. During this testing flow speed conditions are not aggressive in terms of test frequency also because of the probe cards that are used to couple the tester to the device pads.

Final or Package Test (FT) performed on assembled parts executing parametric and functionality checks at the specification limits with the intent of classifying devices in terms of features and quality. This testing phase is to a large extent executed in user mode interfacing. Electrical Wafer Sort is a sequence of test routines carried out on the wafer before and after a baking step, according to the following flow.

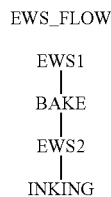

EWS_FLOW

EWS1
|
BAKE
|
EWS2
|
INKING

EWS1—During this first part of the test sequence, the Flash Memories fabricated on the wafer are UV erased, parametric and functionality tests are performed to check the efficiency and to expose possible failures mechanisms also by electrical stressing (the devices for accelerating possible failure mechanisms). Setting of internal references and registers is also performed at this level. Bake—The wafer is placed in an oven at 250° C. for 24 hours. EWS2—During this part of the test sequence, retention checks are performed to verify if any significant charge loss has occurred to memory cells following the accelerated stress of the baking. Inking—Failed dices are marked by inking to discriminate good dices, at assembly level.

The tests performed during EWS can be classified in groups described as follow. Parametric Tests: to verify open circuits, short circuits or current leakage on pins, power consumption. Setting or Trimming Tests: to set and verify configuration of internal registers and of reference cells. Functional Tests: to verify the correct functionality of the device at life time zero for standard operations such as programming, erasing and reading. Reliability Tests: to detect and highlight possible defects in memory array or in the circuitry that may compromise quality of the device. Redundancy Analysis and Repair: some defects are repairable within certain limits depending on device architecture, by using purposely integrated spare elements.

Developing and debugging the software of an EWS flow for a new device to be manufactured is a time consuming and relatively costly job. Testing machines are also expensive. Both the software and the testing hardware have a cost that is commensurate to the complexity and numerosity of tests that must be performed according to the EWS flow to achieve the acceptable reliability. In case of memory devices, the impact that a single routine has on the global time requested to fully test a device depends to a large measure to the size of the memory array.

In the case of memory devices, the main test routines that may be executed via built-in testing are described below. Parallel (double or tetra word) programming using User Mode (UM) or TM through defined accelerator pin. Configuration and redundancy internal register setting, Reference Cell Setting, UM & TM Read pattern (diagonal, CK and CKN), UM & TM Program pattern (diagonal, CK and CKN), Redundancy analysis and Repair, Vgmax and Vgmin search algorithms.

SUMMARY OF THE INVENTION

It has been found that significant savings in terms of a reduced requisite of complexity of the testing hardware and of the software to implement an effective EWS flow by expanding the functions of the micro-controller normally embedded in a FLASH EPROM memory device and of the integrated test structures.

An object of the present invention is to overcome the following technical problems and drawbacks that are normally encountered in the EWS testing of modern FLASH EPROM memory devices, including excessively long testing times; the inability to handle more than 32 MbNeg ECR (Error Catching RAM) by most of the conventional test equipment that is presently used at EWS level; the inability to test memory devices of larger size with existing Error Catch RAM (ECR); unpracticality of establishing a substantially standard test strategy independent of device type, size and fabrication technology; inability to proceed to a relatively easy device debugging and testing even with relatively simple test setups; need for a test equipment provided with ECR and buffer memory for full specification Flash testing; and the impossibility to test the device hardware at the actual specification speed during EWS.

Overcoming these drawbacks has been achieved by expanding the functionality of the onboard micro-controller and test structures to perform the following principal functions: Automatic Reference Trimming Routines; Automatic Threshold Search Routines; VGMAX/VGMIN Algorithms; Matrix Scan by Row/Col/Diagonal; All0/All1/Frame/CK/CKN Pattern Program/Verify; Redundancy analysis Routines; Address Scrambling & Crossover Handling; Auto content addressable memory (Cam) Programming/Soft Programming; Automatic Error Compression Algorithms; Repair Vector generation algorithms; and Analog Voltage measurement in digital form.

To do so, numerous architectural features will be illustrated in detail in the specific descriptions that will follow, moreover, the new architecture includes a "Column Test User Interface" that allows for a standardization of the testing and device debugging phases. The architecture of this invention provides for the execution of the above-listed routines internally without involving any external complex or expensive test equipment to control the test program. The processes are executed by the onboard micro-controllers (that may be reading either from an embedded ROM or from a GLOBAL CACHE purposely provided). Such a GLOBAL CACHE may be downloaded with the desired routine to a TUI block and provides a full test flexibility also at device debug level.

Managing test routines by an internal process allows the device architecture to be transparent from a tester point of view, by purposely creating a standard interface with a set of defined commands and instructions to be interpreted by the on board micro-controller and internally executed.

Advantages derivable through an implementation of the architecture of this invention include: Standardize TM protocol on different Flash Memory devices; Faster debug of new products to contribute positively to decrease time to market; Re-use of outdated test equipment, considering the case of testers with limits on frequency accuracy, memory space, CPU speed, advanced features, redundancy analysis; Extension of tester equipment life; Faster porting on different tester platforms—code development is almost standard and easily portable on different testers; Use of low-cost or parallel architecture testers; Cost saving on tester hardware and software accessories and options—i.e. buffer memory (BM), Error Catch RAM (ECR), Vector Memory (VM), pin electronics (p.e.), frequency range, bitmap tools.

BRIEF DESCRIPTION OF THE DRAWINGS

The purposely modified architecture of self test, setting of internal references and registers, programming the timing phases (CK, CKN) in a topologically consistent fashion, redundancy analysis and the like as well as the special processes for performing the above-mentioned internal functions will be described in detail by referring to the attached drawings, wherein.

DETAILED DESCRIPTION OF THE PREFERRED EMBODIMENTS

Figure 1:
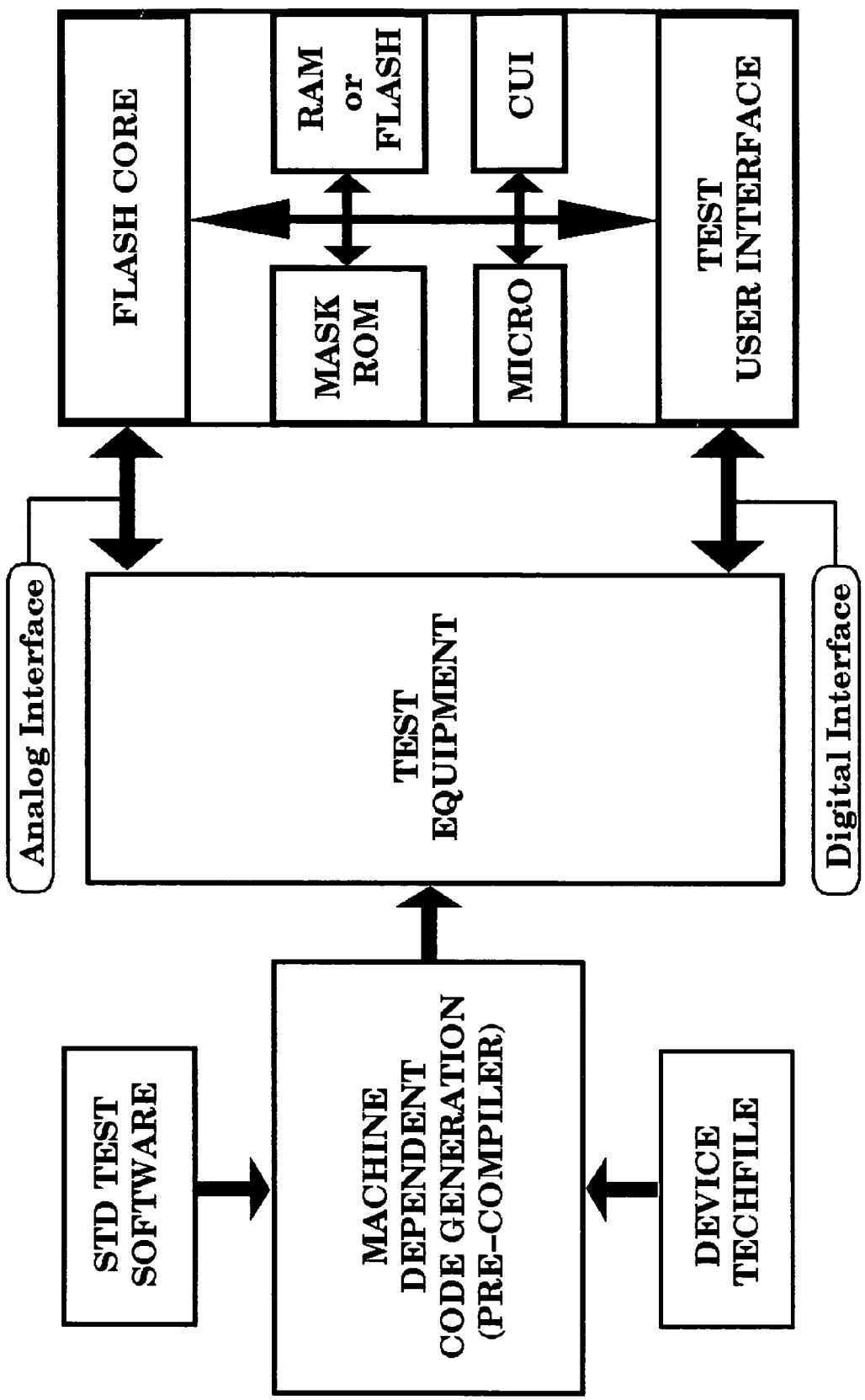
FIG. 1 is a high level block diagram of a FLASH EPROM memory device test layout according to the built-in EWS architecture and methodology of the present invention.
Figure 2:
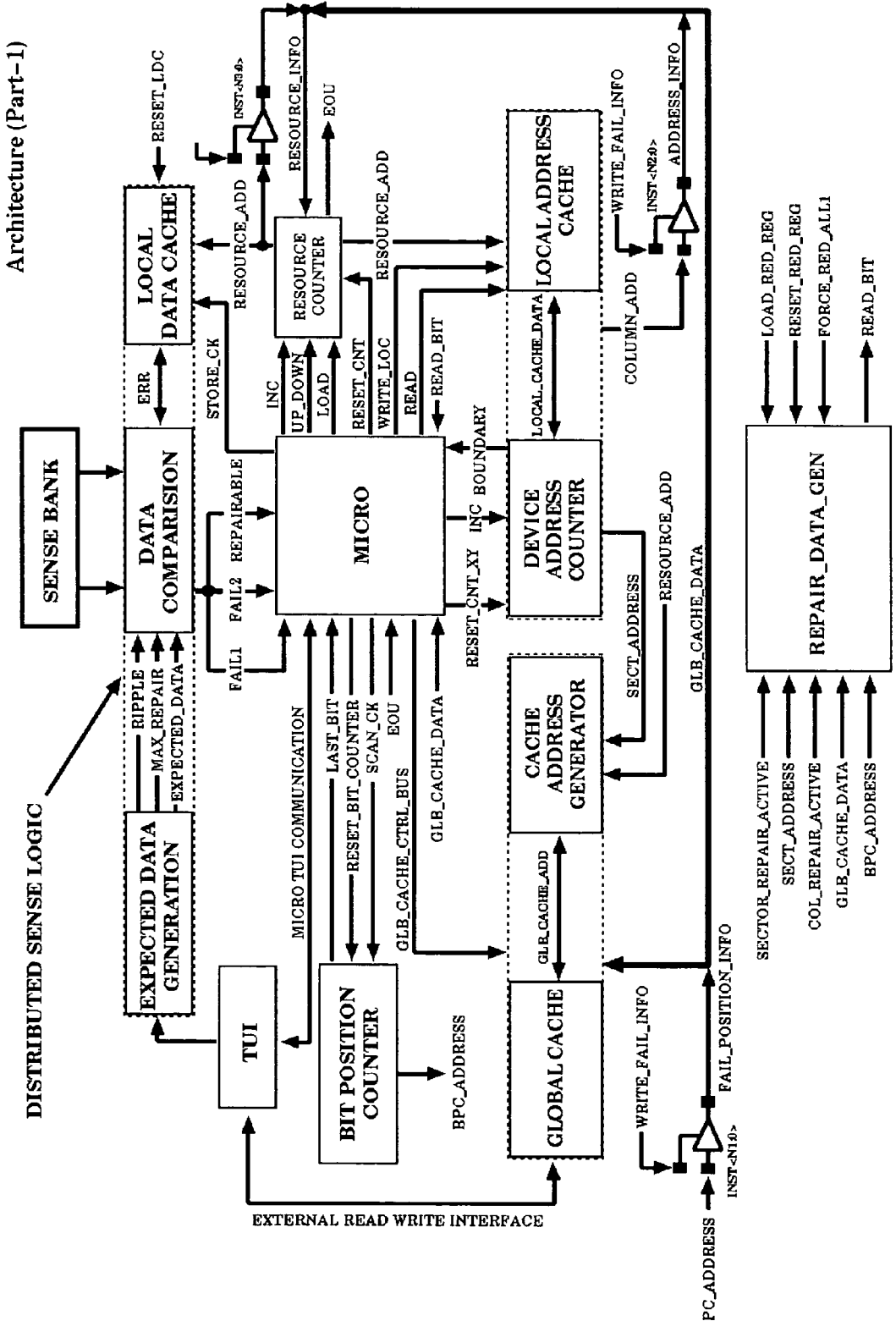
FIG. 2 is a block diagram of the system architecture showing the fundamental functional blocks that define it.
Figure 3:
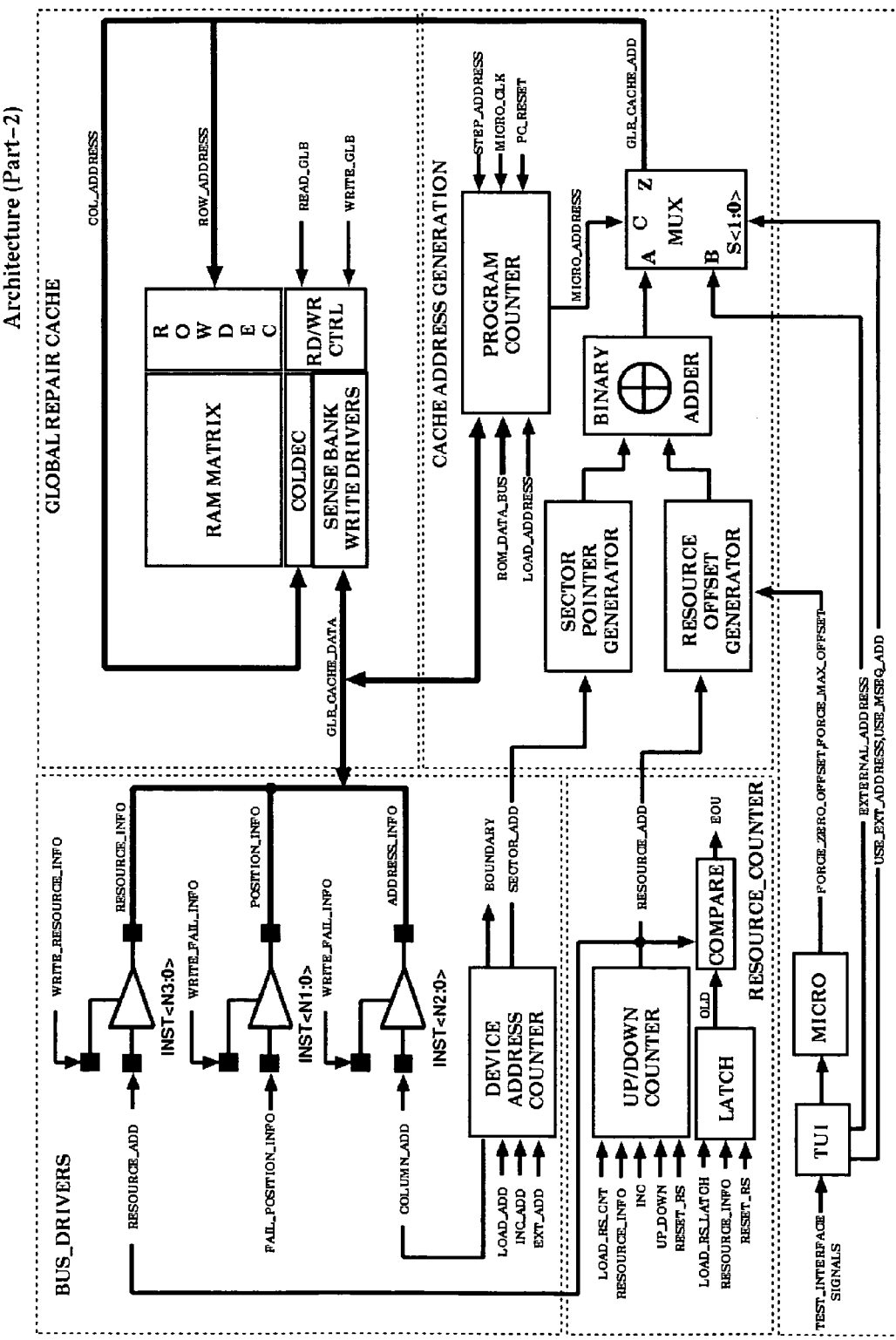
FIG. 3 is a block diagram focusing on the structure that implements the algorithm of detection of errors and generation of redundancy vectors.
Figure 4:
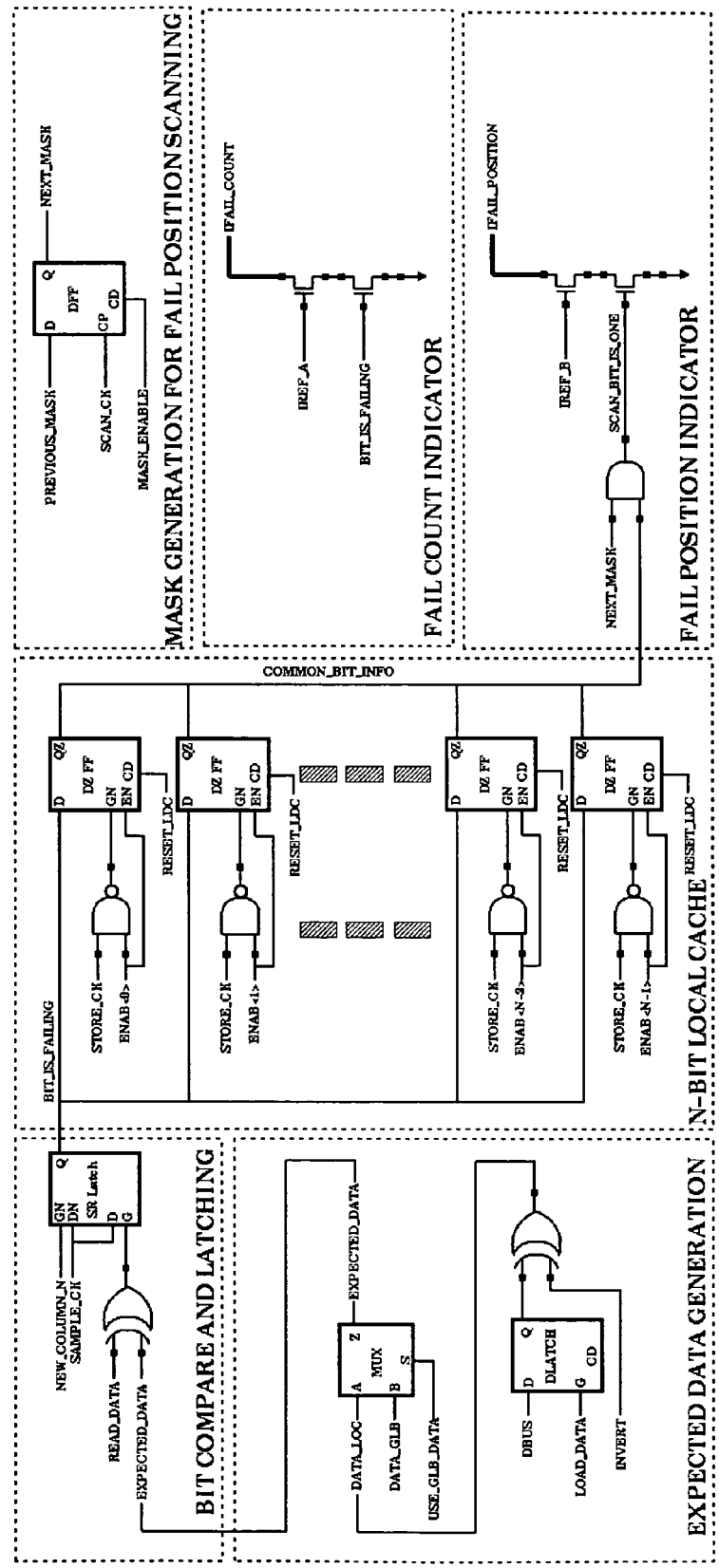
FIG. 4 shows the circuit of details of the distributor sense logic section of the block diagram of FIG. 2.
Figure 5:
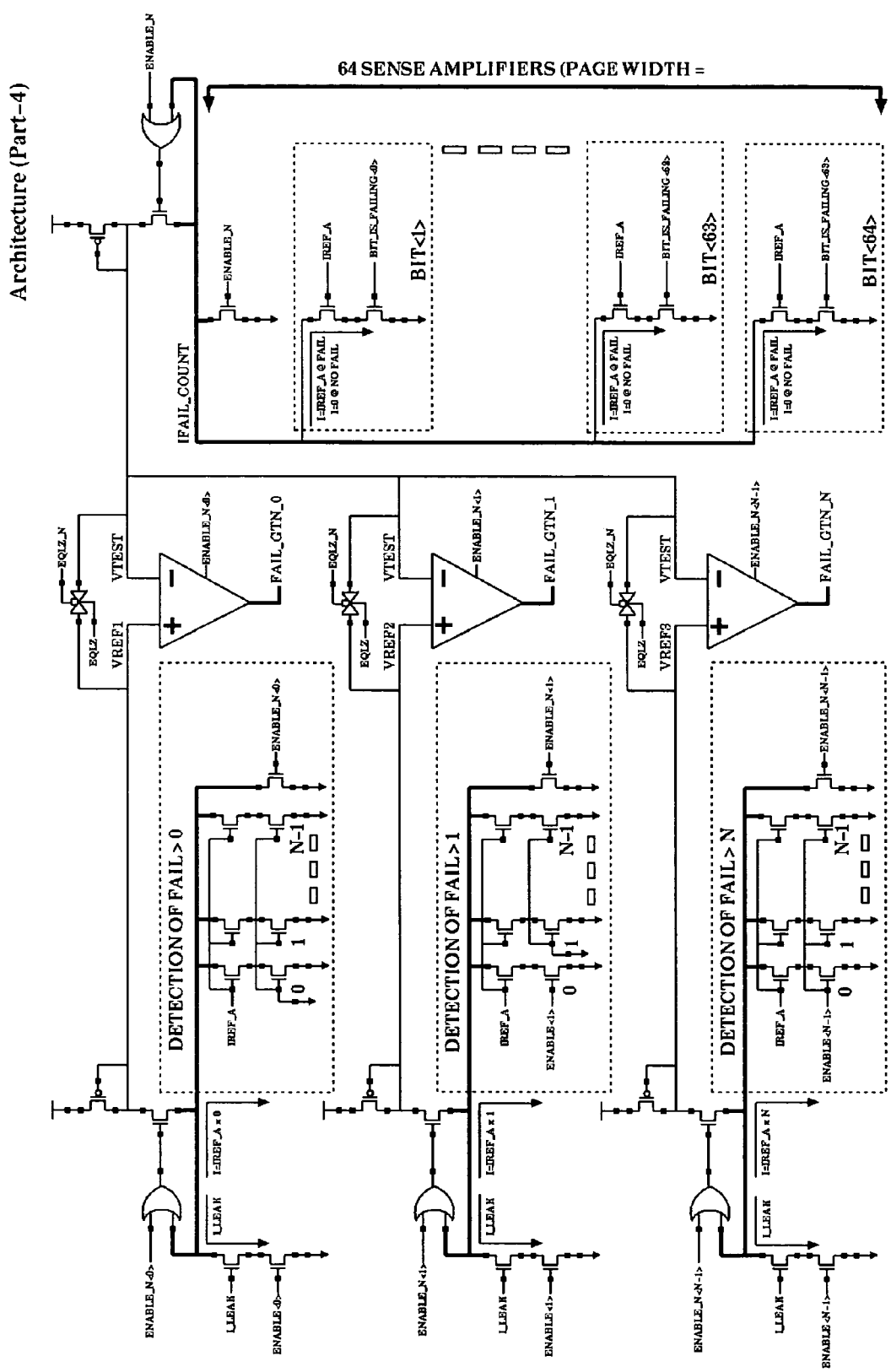
FIG. 5 shows circuit details of the sense amplifier of data comparison.
Figure 6:
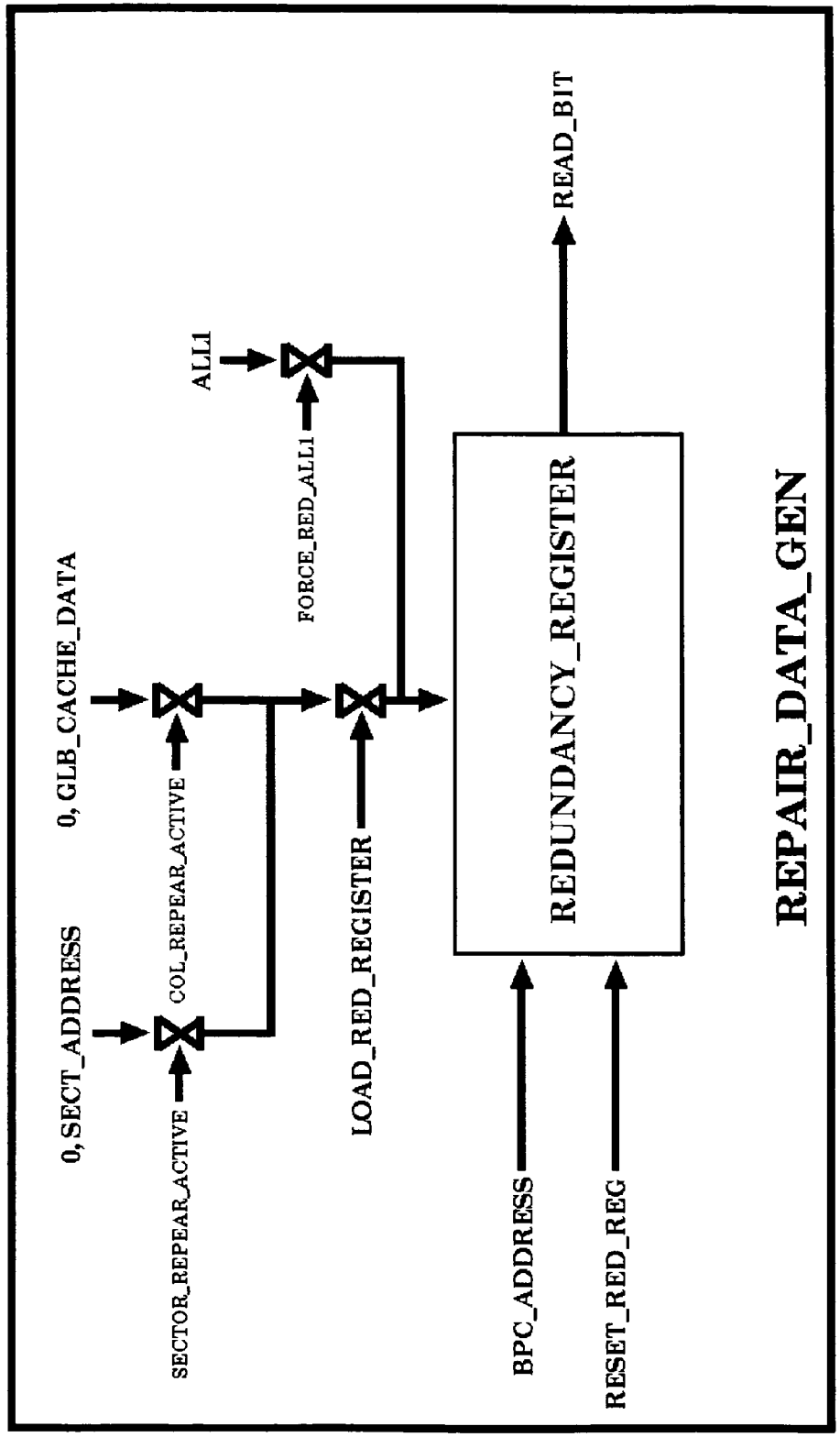
FIG. 6 is a detailed diagram of the REPAIR_DATA_GEN block of FIG. 2.

The built-in system according to the present invention is based on an architecture, a high level diagram of which is depicted in FIG. 2. The fundamental circuit blocks and their respective functions are as follows:

EXPECTED DATA GENERATION: generates the expected datum;

DATA COMPARISON: compares the expected datum with the datum read by the sense amplifier and writes the result of the comparison on the LOCAL_DATA_CACHE;

LOCAL DATA CACHE: it is composed of N registers, equal to the number of column redundancy resources available for each sector of the memory array, each of which is composed by M bit (where M coincides with the read parallelism of the SENSE BANK). A vector containing the information relatives to the bits on which a failure has occurred is stored in the register;

RESOURCE COUNTER: it contains an up/down counter, the purpose of which is to point to one of the register of the LOCAL DATA CACHE to one of the registers of the LOCAL ADDRESS CACHE and to the location of the GLOBAL CACHE on which information relative to the found failure may be written. Moreover it contains a latch in which preserve the pointer value.

LOCAL ADDRESS CACHE: in it are stored the column addresses (max N) on which failures have occurred;

DEVICE ADDRESS COUNTER: it is the counter of the addresses of the memory device;

CACHE ADDRESS GENERATOR: usually, it generates the current address of the GLOBAL CACHE starting from the address of the addresses sector (coming from the block DEVICE ADDRESS COUNTER) and from the content of the RESOURCE COUNTER. Alternatively, it is possible to address the GLOBAL_CACHE using an external address coming from the TUI. Moreover, the GLOBAL_CACHE may be addressed through the block PROGRAM_COUNTER, that is normally used for addressing the ROM of the microprocessor. The selection of the above-mentioned modes is managed by a multiplexer driven by the signals USE_EXT_ADDRESS and USE_MSEQ_ADDRESS;

GLOBAL CACHE: it is the memory in which, at the end of the scanning of each sector, information relative to the failures discovered in the sector are stored in a compressed form. The access to the GLOBAL_DATA_CACHE, both in reading and in writing takes place through a data bus called GLB_CACHE_DATA. The access in writing to the bus takes place through BUS_DRIVERS, properly driven by the control signal WRITE_FAIL_INFO, WRITE_RESOURCE_INFO and WRITE_GLB. These control signals are managed by the MICRO. Access in reading to the GLB_CACHE_DATA by the various components of the system takes place through the signal READ_GLB, after having properly addressed the location to read in the GLOBAL_CACHE by way of the block CACHE_ADDRESS_GENERATOR. The control signal of the GLOBAL_CACHE may be provided either through the bus EXT_RD_WR_INTERFACE, coming from the TUI or by the bus GLB_CACHE_CTRL_BUS coming from the MICRO;

BUS_DRIVERS: They are used for permitting the access in writing to GLB_CACHE_DATA and then to the GLOBAL_CACHE. The information written in the GLOBAL_CACHE may be of various types:

i) RESOURCE_INFO, that is the content of the RESOURCE_COUNTER;

ii) POSITION_INFO, that is the information of the position of the bit fails in a compressed form;

iii) ADDRESS_INFO, that is the address of the fail column;

iv) information of other kind written in the GLOBAL_CACHE through the TUI and used for executing specific test routines;

BIT POSITION COUNTER: it is a counter of modulus M, the purpose of which is to scan the LOCAL DATA CACHE by one bit at the time.

TUI: it is the test mode commands interface, the function of which is to manage the interfacing between the test system and the external world, to permit management of the phases of the various test processes;

REPAIR-DATA_GEN: this block contains a register called REDUNDANCY_REGISTER on which the redundancy vector to be programmed in the cams may be stored during the execution of the programming process of the cams themselves and the selection paths of information to be programmed.

Description of the Process of Detection Fails and of Generation of Redundancy Vectors Detection of fails in reading the identification of failed memory cells is commonly done by sector. Identification of fail cells is done by scanning the memory locations of the sectors and by comparing the read datum with the expected one. The scanning is done by column, incrementing the row address between a read operation and the next.

Before starting the redundancy analysis a global reset is performed. Redundancy analysis which is carried out from one sector at the time is added. The number of resources already used for the sector to be analyzed is read from GLOBAL CACHE. This information is loaded in the RESOURCE COUNTER through the control signal LOAD_RS_LATCH and LOAD_RS_CNT. Of course, if the sector has been analyzed for the first time, the number of resources already used is equal to 0.

Access to the first field of the GLOBAL_CACHE, containing the number of resources already used for the sector under analysis, is obtained by reading the GLOBAL_CACHE by the signal READ_GLB, after having forced the signal FORCE_ZERO_OFFSET. Thereafter, the scanning of the memory location of the matrix takes place by incrementing the column address.

When a column (noting that the expression column is not intended to mean a physical column of cells but all of the physical columns that are read in parallel according to the parallelism parameter M allowed by the memory architecture) has been completely scanned, three different situations may be present:

1) no failures are detected, in which case the column address is incremented and the following column is scanned;

2) a number greater than X (2 in the case considered) fails have been found, where X is the maximum number of repairable physical column belonging to the same column address. In this case, the scanning of the sector is stopped because the sector is surely repairable by exploiting column redundancy, but will need to be repaired by using sector redundancy instead. In particular, the signal FORCE_MAX_OFFSET is forced to a logic "1" such to enable addressing the last field within the GLOBAL_CACHE, that is a field containing the information relative to the fact that a sector should be redundant by exploiting sector redundancy. Such an information is stored in this field by an impulse on the signal MARK_SECT_FAIL;

3) a number Y of failures have been detected, with Y at most equal to X. In such a case, the column address in correspondence of which the failure has been detected is stored in the LOCAL ADDRESS CACHE and the failure vector is stored in the LOCAL DATA CACHE. The RESOURCE COUNTER is incremented and all these actions are repeated Y times. In this way, there will be Y registers of the LOCAL DATA CACHE and Y registers of the LOCAL ADDRESS CACHE that will contain the same information. Once completed this operation, if the content (RESOURCE_ADD) of the RESOURCE COUNTER is larger than the maximum number N of available resources for each sector, the scanning of the sector is stopped because the sector is not repairable through column redundancy. It will need to be repaired by a recourse to sector redundancy. The sequence of operations necessary for signaling this situation is equivalent to the one previously described.

If the above-condition does not occur, the column address is incremented and the next column is scanned. When all the sector has been scanned, in the RESOURCE COUNTER will be present the total number of resources necessary for preparing the sector. This is equal to the sum of the number of resources already used before the last redundancy analysis of the sector and of all necessary for preparing the fails detected during the last scanning.

In the registers of the LOCAL ADDRESS CACHE will be present the column addresses at which failures have been detected. In the registers of the LOCAL DATA CACHE will be stored vectors pointing to the position of the physical column in which the fails have been found. Once terminated the scanning of an all sector, the MICRO writes in the GLOBAL CACHE the total number of resources used for the sector in question, the column addresses at which failures have been found and the position of the failed physical columns.

Thereafter, the content of the RESOURCE COUNTER is compared with the content that the same counter had before starting the new scanning, stored in the LATCH of the RESOURCE_COUNTER. If the two values are equal (EOU is active), there has not been new failure and the content of the GLOBAL CACHE does not need updating. On the contrary, if the value contains in the RESOURCE COUNTER is greater than the one stored before the scanning, new failures have occurs that must therefore be added to the failures already recorded in the GLOBAL CACHE. In the latter case it is therefore necessary to store these new failures within the GLOBAL CACHE.

All this takes place in the following manner. Initially, the new value of the RESOURCE_ADD is stored thus overwriting the preceding value. The new value is used as pointer to the GLOBAL CACHE (combined with the sector address), to the LOCAL DATA CACHE and to the LOCAL ADDRESS CACHE. The BIT POSITION COUNTER is also reset. The register of the LOCAL DATA CACHE pointed by the RESOURCE_ADD is scanned bit by bit until a bit fail is found. While this scanning takes place, the BIT POSITION COUNTER is incremented. As soon as a bit fail is found, the column address has reached a fail has been detected (contained in the LOCAL ADDRESS CACHE) and its location (contained in the BIT POSITION COUNTER) are written in sequence in the GLOBAL CACHE. The RESOURCE COUNTER is decrement.

If other bit fails in the same fail vector are present, the bit by bit scanning is continued from the point in which it was interrupted and these other bit fails are stored in the GLOBAL CACHE. Once the scanning has terminated, the BIT POSITION COUNTER is reset and a new scanning starts and so forced until the value of the resource counter coincides with the starting value (EOU becomes active) and therefore until all new bit fails that have been found have been recorded in the GLOBAL CACHE.

Figure 7A:
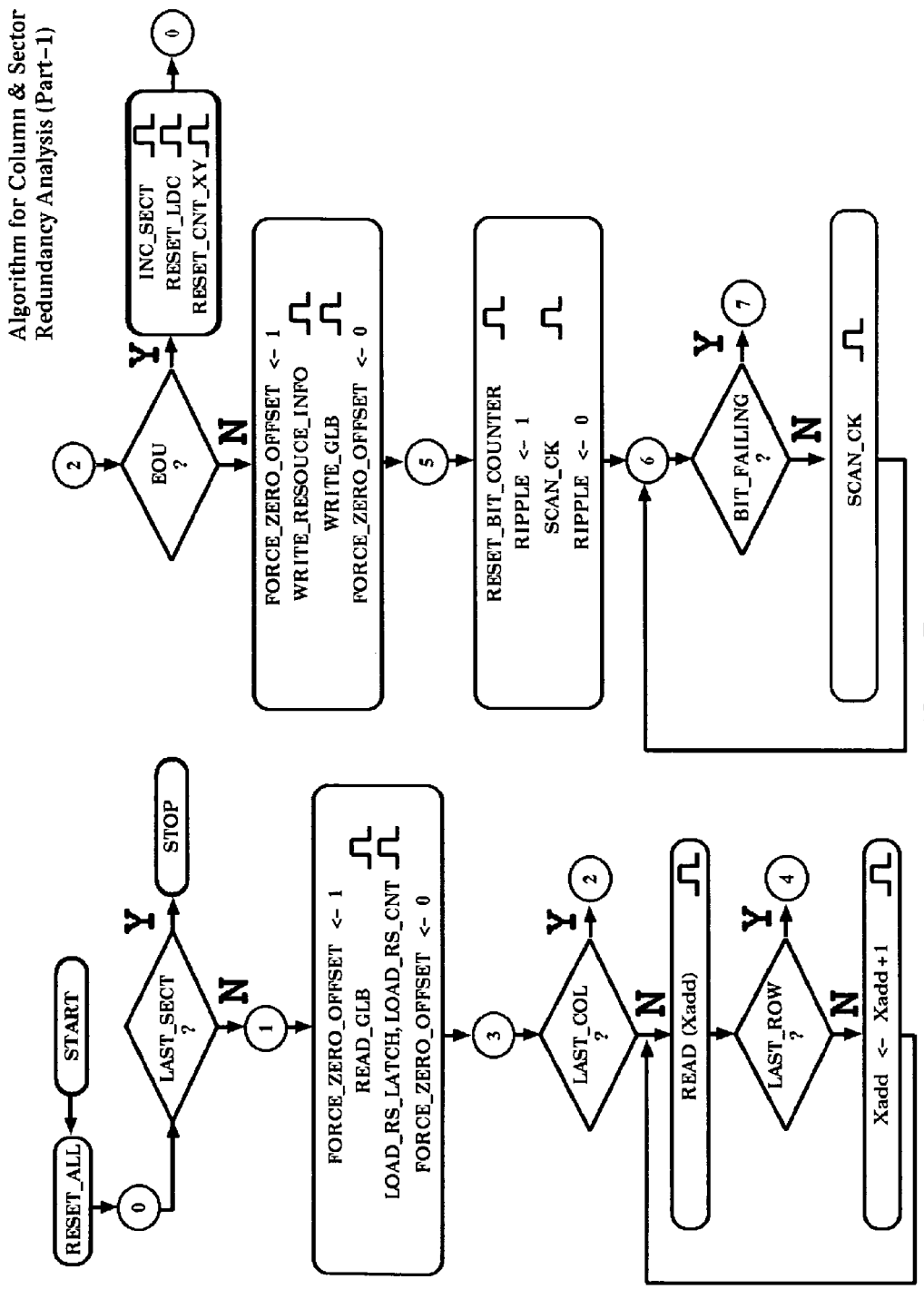
FIGS. 7a, 7b and 7c show the flow chart of the process of column and sector redundancy analysis.
Figure 7B:
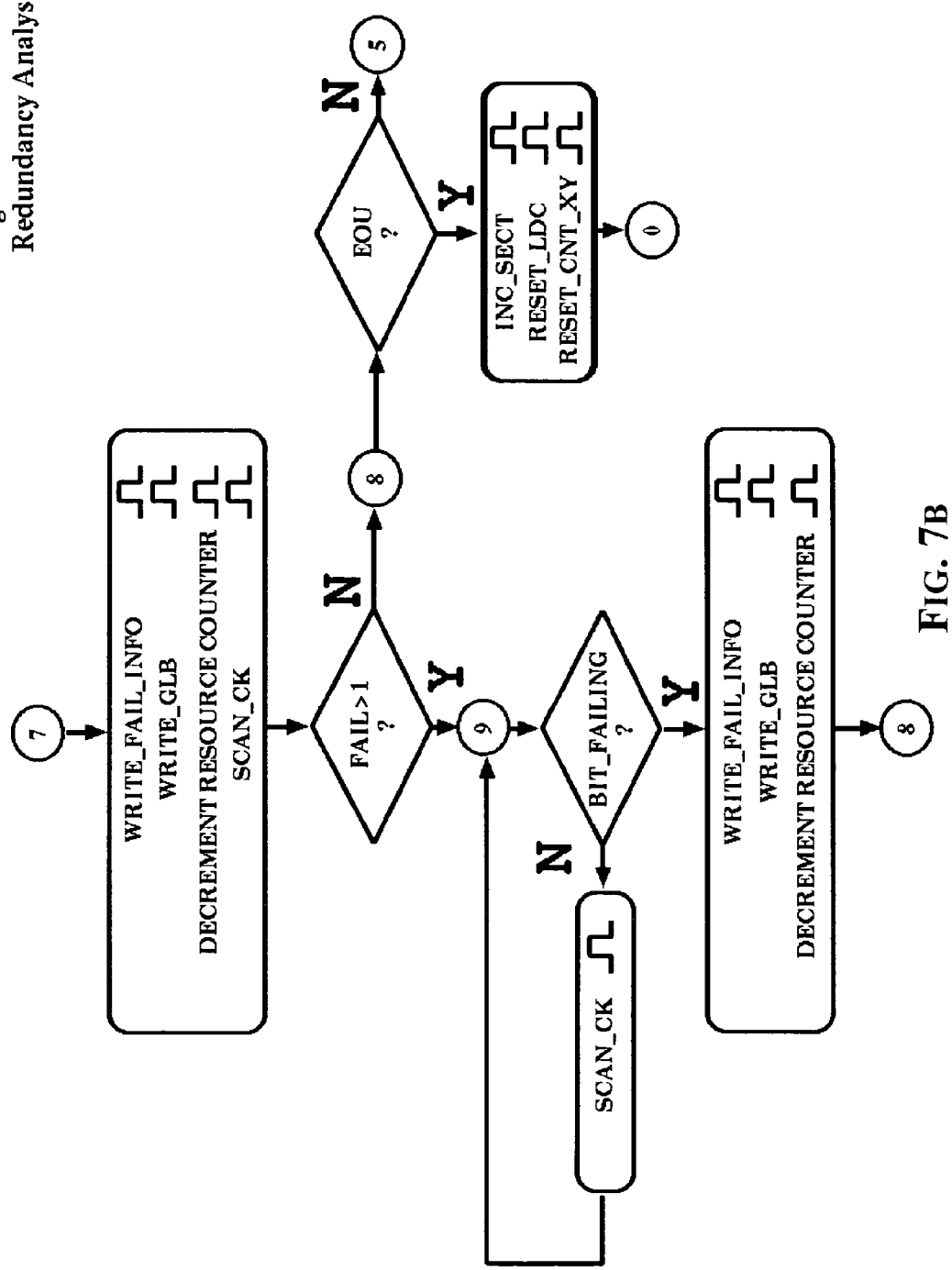
Figure 7C:
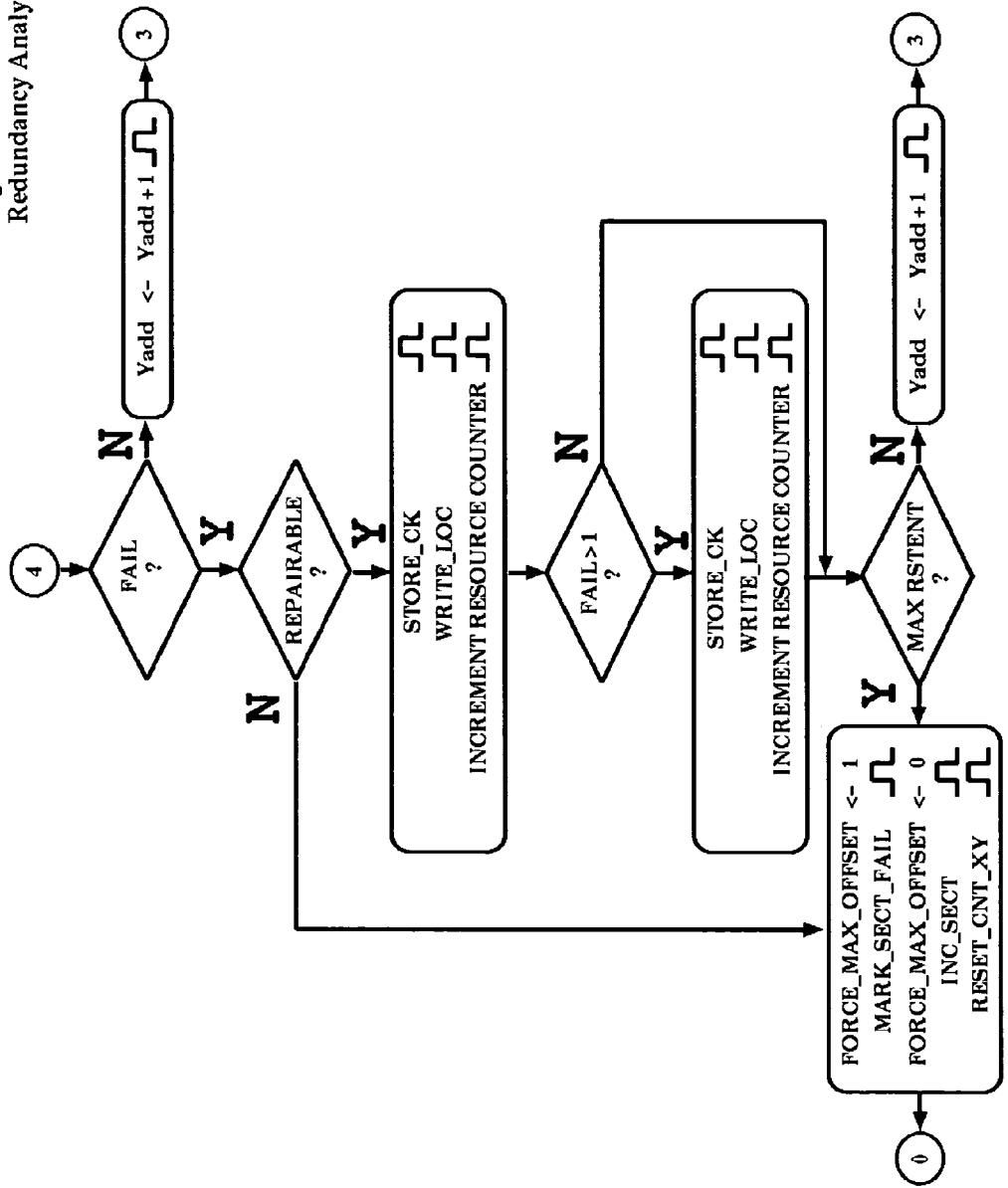

When the storing of the fails of the all sectors has concluded, the analysis of the next sector is started, after having reset the LOCAL_DATA_CACHE (by way of an impulse of the signal RESET_LDC) and the value of the column and row addresses provided by the DEVICE_ADDRESS_COUNTER (by way of an impulse of the signal RESET_CNT_XY). The above-described process is illustrated in detail in the flow chart of FIG. 7a, 7b and 7c.

Automatic Programming of Cams

After having completed a sector and column redundancy analysis, the information on the basis of which the redundancy cams may be properly programmed are available. This information is stored within the GLOBAL CACHE and is organized in records. Each record is associated to one specific sector and is formed by a certain number of fields. The first of these fields contains the number of column redundancy used for the specific sector. The following fields contain the information necessary for identify the address of columns to be redundant and to the sense amplifiers to which they pertain. The last field of each record indicates whether the sector in question is to be fully redundant by sector redundancy.

As already mentioned above, starting from information contained in the GLOBAL CACHE it is possible to obtain the redundancy vectors, that is the vectors to be programmed for sector redundancy and in the cams to be programmed for column redundancy. In particular, the sector redundancy vectors, all of this contain two fields: the guard bit and the address of the sector to be redundant. The column redundancy vectors contain three fields: the guard bit, the address corresponding to the column to be redundant and the sense amplifier to which such a column pertains.

The process of automatic programming of redundancy cams starting from information produced by the redundancy analysis itself will be described herein below. Commonly the redundancy cams belonging to a same vector occupy adjacent topological positions, that are addressable by topologically consecutive addresses, generally column addresses. Moreover, the same vectors are in their turn topologically consecutive to another. Each cam is composed of two groups of flash cells, connected to the two sides of a latch. In the description that follows, it will be assumed that each group of flash cells is composed of a single cell. The setting of a cam equals programming the flash cells connected to one only of the two side of the latch. Depending on which side has been programmed, the latch will imbalance itself to one of the two permitted stable states.

The following approach is noted:
CAM set to 1↔Left side programmed
CAM set to 0↔Right side programmed Therefore, the programming of the redundancy vectors includes programming in succession the corresponding cam vectors. Moreover, for each cam the left side or the right side will be programmed depending on the content the cam must have. It should be noted that in any case, even when a specific redundancy resource should not be used, the bit of the vector of the cams corresponding to the resource must be set in any case. This must be so to avoid the presence of undesirable current absorption in the latch of the cam.

In the embodiment being illustrated, when a resource is used, the bit of the corresponding cams are all set to 1. The architecture that is used for the automatic programming of the cams and for carrying out the processes of sector and column redundancy programming of the cams uses: a RESOURCE COUNTER for counting number of resources to be used; a REDUNDANCY_REGISTER on which storing the current redundancy vector which is contained in the block REPAIR_DATA_GEN of FIG. 2; a BIT_POSITION_COUNTER the value of which points to a particular bit of the REDUNDANCY_REGISTER; the system's MICRO used for managing the value phases of execution of the programming processes and of the relative control signals; the GLOBAL CACHE MEMORY, in which information relative to the failed sectors and to the failed columns has been already stored; and the DEVICE ADDRESS COUNTER counting the system's addresses.

Sector Redundancy

The sector redundancy cams are commonly organized within an array of a single row and a number of columns equal to: N×Z×2, where N is the number of sector redundancy sources available, Z is the number of bits contained in each sector redundancy vector (equal to the number of bits of the sector address +1 bit because of the presence of a guard bit) and 2 is the multiplier accounting for the fact that each cam is composed of two cells (one connected to the left side and the other to the right side of the latch).

As already mentioned, a sector redundancy vector contains a first field composed of a single guard bit (which is 0 if the redundancy resource is used or 1 if on the contrary the resource is unused) and a second field in which the fail sector address is stored.

The programming process of the sector redundancy cams starts, after a global reset of the system, with the enabling of the signal SECTOR_REPAIR_ACTIVE. This is done to select the access path to the REDUNDACY_REGISTER that permits the input of a "0" on the guard bit and of the sector address bits in the remaining bits. The next step is the setting to "1" the signal FORCE_MAX_OFFSET, to point within the global cache to the last field, that is the field that informs whether the sector currently addressed through the DEVICE_ADDRESS_COUNTER is a failed sector or not. If the sector is not failed, it will not need to be redundant and the analysis passes to the following sectors. On the contrary, if the sector is failed it will need to be redundant.

Each time, a failed sector is encountered, the RESOURCE_COUNTER is incremented and a check is made to establish whether the number of redundancy resources required so far is larger to the number of available resources. If so, the process sets a fail and exit. On the contrary, if there are still resources available, the sector redundancy vector that must be recorded in the cams is loaded in the REDUNDANCY_REGISTER by enabling the signal LOAD_RED_COUNTER, in which it should be recorded points to one of the bits of the REDUNDANCY_REGISTER. The bit of the REDUNDANCY_REGISTER is read one at a time and depending on the value the cams are properly programmed.

Figure 8:
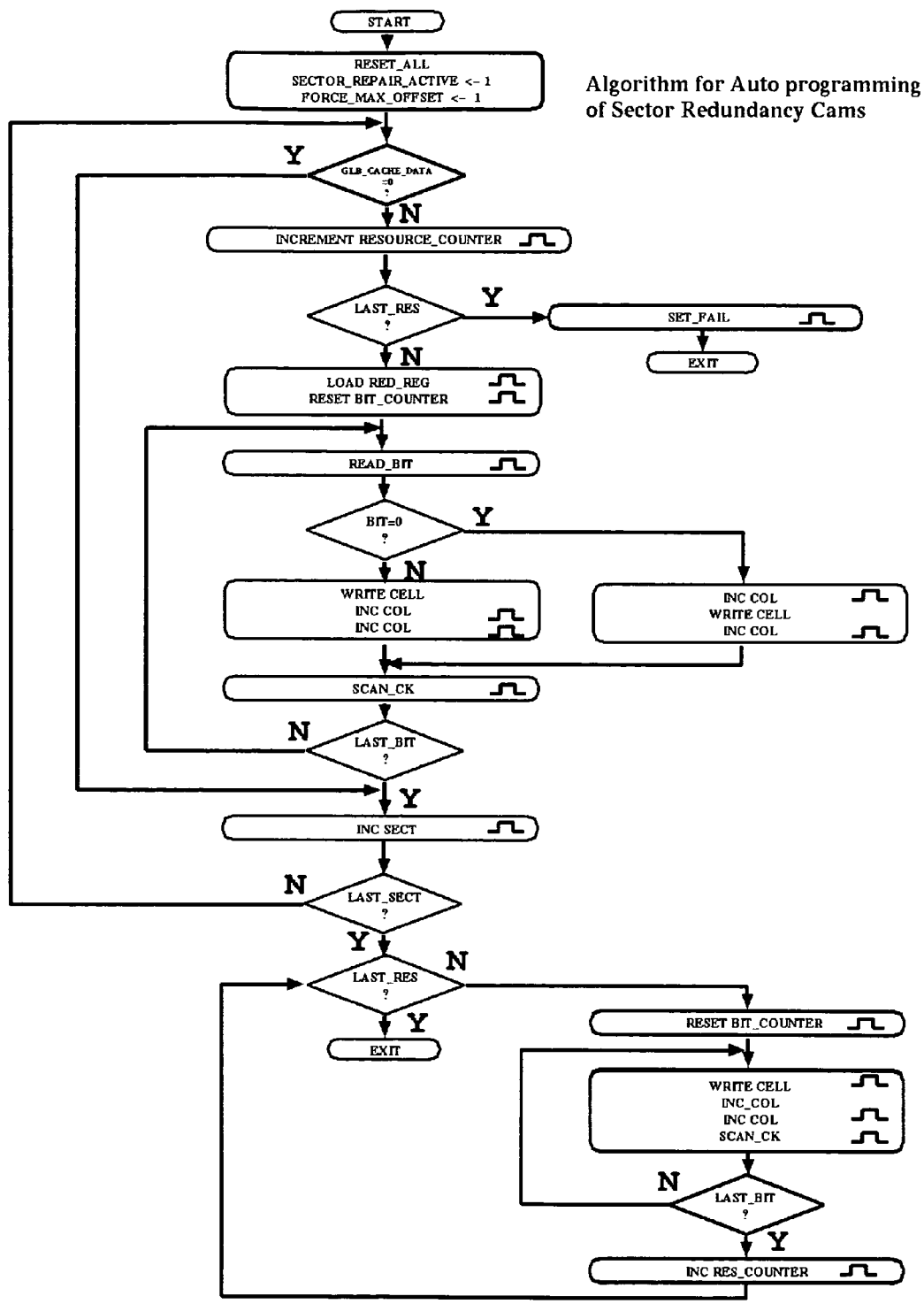
FIG. 8 is the flow chart of the process of auto programming of sector redundancy cams.

The scanning of the cams within the array of sector redundancy cams is done by using the column address which is properly incremented. Once the scanning of all sectors has finished, if not all the redundancy resources have been used, the remaining resources are programmed by storing in all the cams of such resources the logic value 1. The process of programming of the sector redundancy cams is illustrated in the flow chart of FIG. 8.

Column Redundancy

The column redundancy cams are commonly organized within an array with a number of rows equal to the number of sectors and a number of column equal to: M×K×2, where M is the number of column redundancy sources available, K is the number of bits contained in each column redundancy vector (equal to the number of bits of the column address+1 bit because of the presence of a guard bit) and 2 is the multiplier accounting for the fact that each cam is composed of two cells (one connected to the left side and the other to the right side of the latch).

As already mentioned, a column redundancy vector contains a first field composed of a single guard bit (which is 0 if the particular redundancy resource is used or 1 if on the contrary the particular resource is unused) and a second field in which is stored the fail column address and a third field containing the information on the column to be redundant.

The process of programming of the column redundancy cams starts, after a global system reset, with the enabling of the signal COL_REPAIR_ACTIVE. This is done to select the access path to the REDUNDACY_REGISTER that permits the input of a "0" on the guard bit and of the vector coming from the GLOBAL_CACHE on the other bits. It should be noted that this vector contains in fact the second and the third field of the column redundancy vectors.

Thereafter, after having reset the column address of the DEVICE_ADDRESS_COUNTER and the content of the RESOURCE_COUNTER, the signal FORCE_ZERO_OFFSET is forced to the logic state 1 and the first field of the GLOBAL_CACHE containing the number of column redundancy resources needed for the sector currently addressed is loaded in the latch of the RESOURCE_COUNTER. The scanning and subsequent programming in sequence of the vectors of the cams corresponding to such resources follow.

Figure 9:
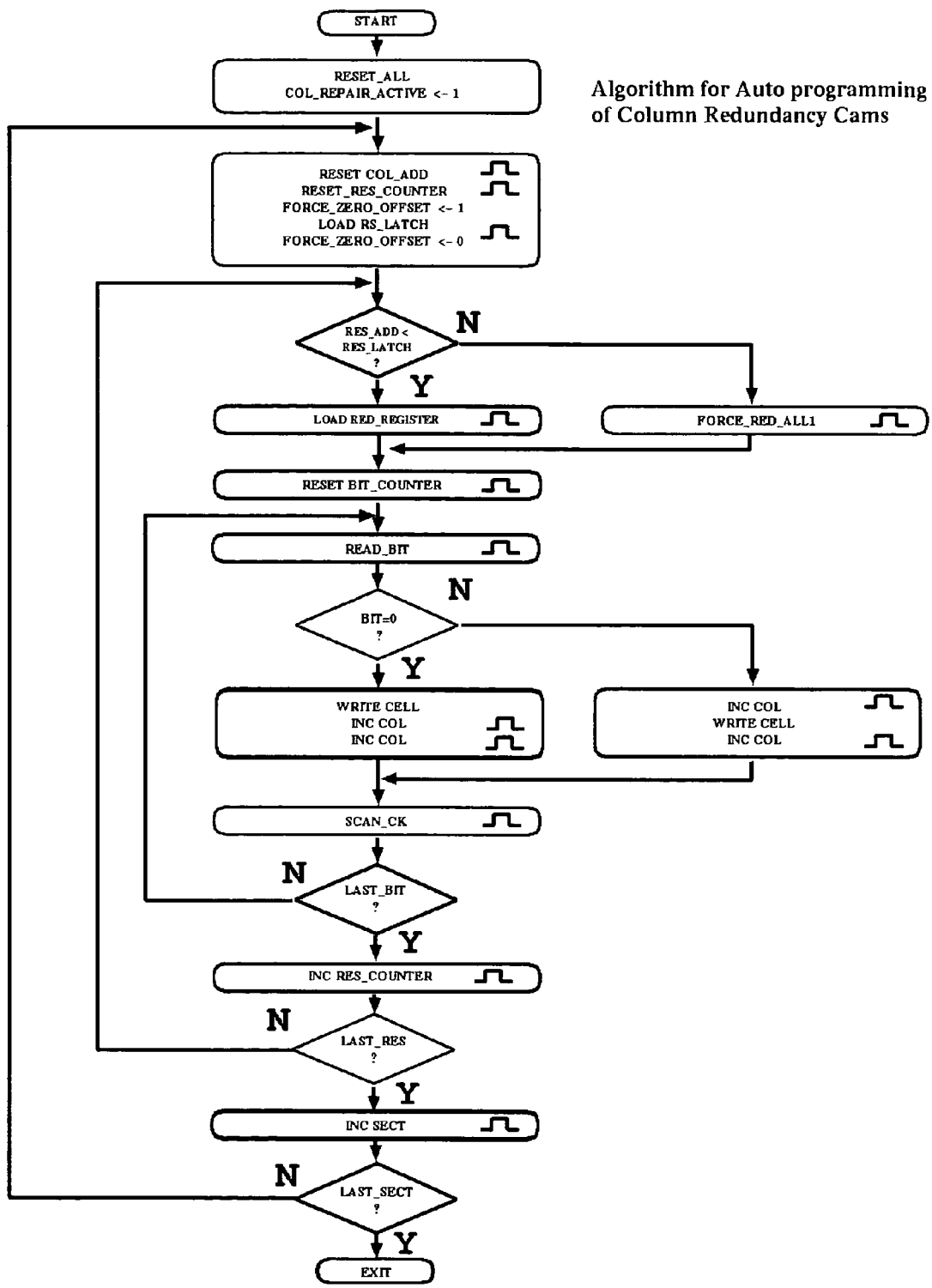
FIG. 9 is the flow chart of the process of auto programming of column redundancy cams.

Finally, if for the sector in question not all the column redundancy resources have been used, all the bits of the unused resources are programmed to 1 by loading in the REDUNDANCY_REGISTER a vector with all its bits to 1 by means of the signal FORCE_RED_ALL1. The operation finishes when all the sectors have been scanned. The process is illustrated in the flow chart of FIG. 9.

Architecture for Self-setting of References

Figure 10:
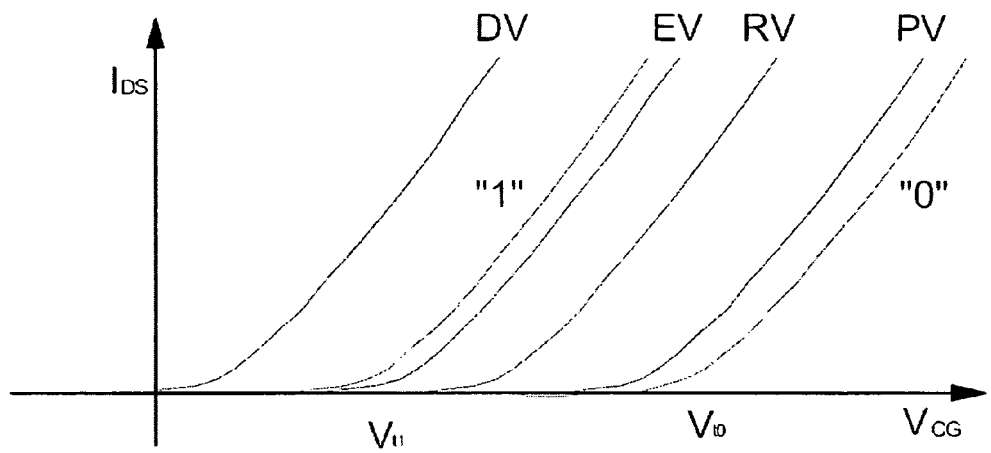
FIG. 10 shows the trans-characteristics of reference cells.

Flash Memory devices are normally provided with four reference cells namely for: Depletion Verify (DV), erase Verify (EV), read Verify (RV) and Program Verify (PV). The trans-characteristics of reference cells in the (VCG, IDS) diagram is shown in FIG. 10. Internal programming and erase operations are verified using the above said four reference cells. Therefore it is important to precisely and correctly setting these reference cells at EWS sort level.

Figure 11:
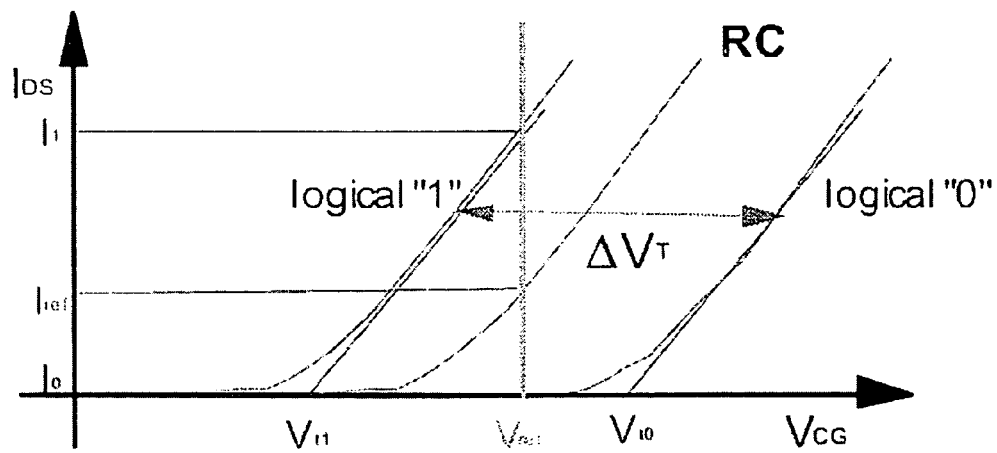
FIGS. 11 and 12 illustrate the sensing operation.
Figure 12:
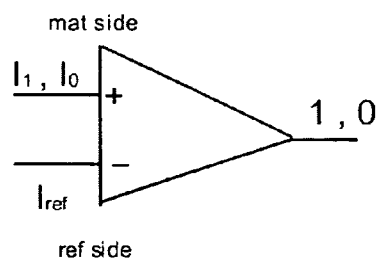

The RV reference cell is used to discriminate if a memory cell (bit) must be classified as a logical 1 (erased) or a logical 0 (programmed). The reading of a bit is effected by comparing drain current (IDS) of the selected cell array cell with that of the RV reference cell by a sense amplifier (briefly "sense"). The discrimination that is carried out by the sense amp of FIG. 12 is illustrated by way of the characteristics shown in FIG. 11. The two currents are converted in voltage values (mat-side & ref-side) that are sensed by using a differential amplifier. The sense amp outputs a logical value 0 or 1 depending on the result of comparison.

Figure 13:
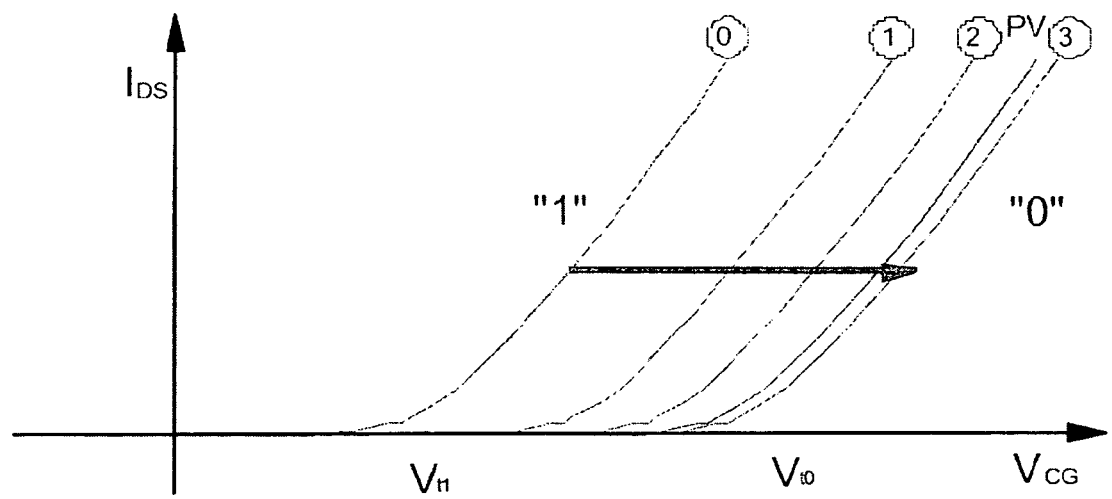
FIG. 13 illustrates the program of a flash cell by a program-verify technique.

While RV is used in UM (user mode) reading phases PV is used to establish if a bit can be considered programmed after a program attempt is made on the cell. The internal logic circuitry of the Flash memory performs the task of applying program pulses followed by a verify operation that compares the current sunk by the cell being programmed with that of the PV reference cell at a fixed gate voltage, according to the characteristics shown in FIG. 13.

Figure 14:
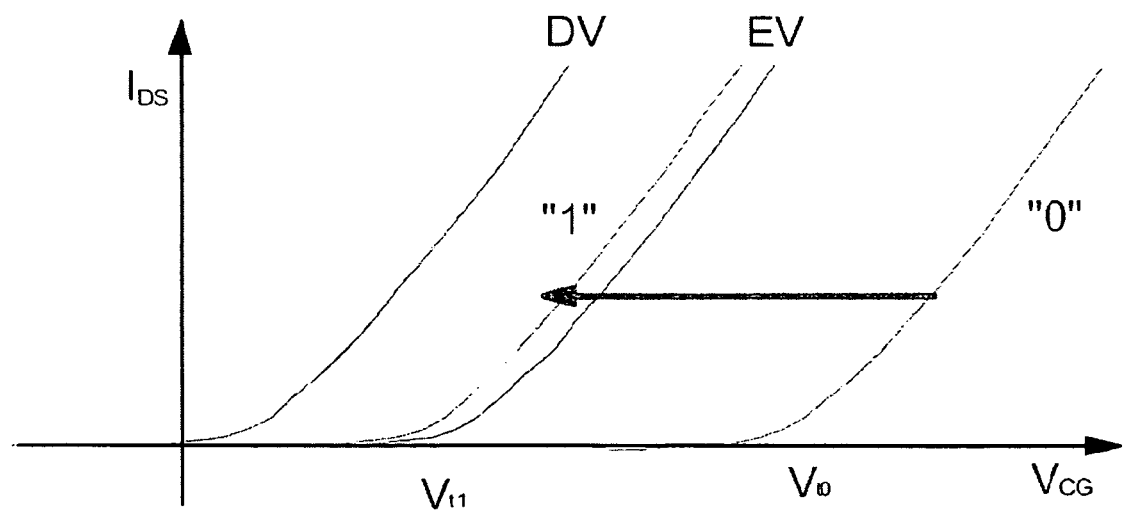
FIG. 14 illustrates the erasing of a flash cell by depletion verify and erase verify technique.

Similarly the EV reference cell is used to determine if a cell has been sufficiently erased after an erase pulse applied to the cell (together to the other cells that compose at least a unit of information). However, because an erase pulse may cause some of the cells to get over erased and become depleted (Vt<0), a soft programming operation needs to be performed after a successful erase verify to bring any depleted cell above DV reference cell threshold. The mechanism is illustrated in FIG. 14.

Figure 15:
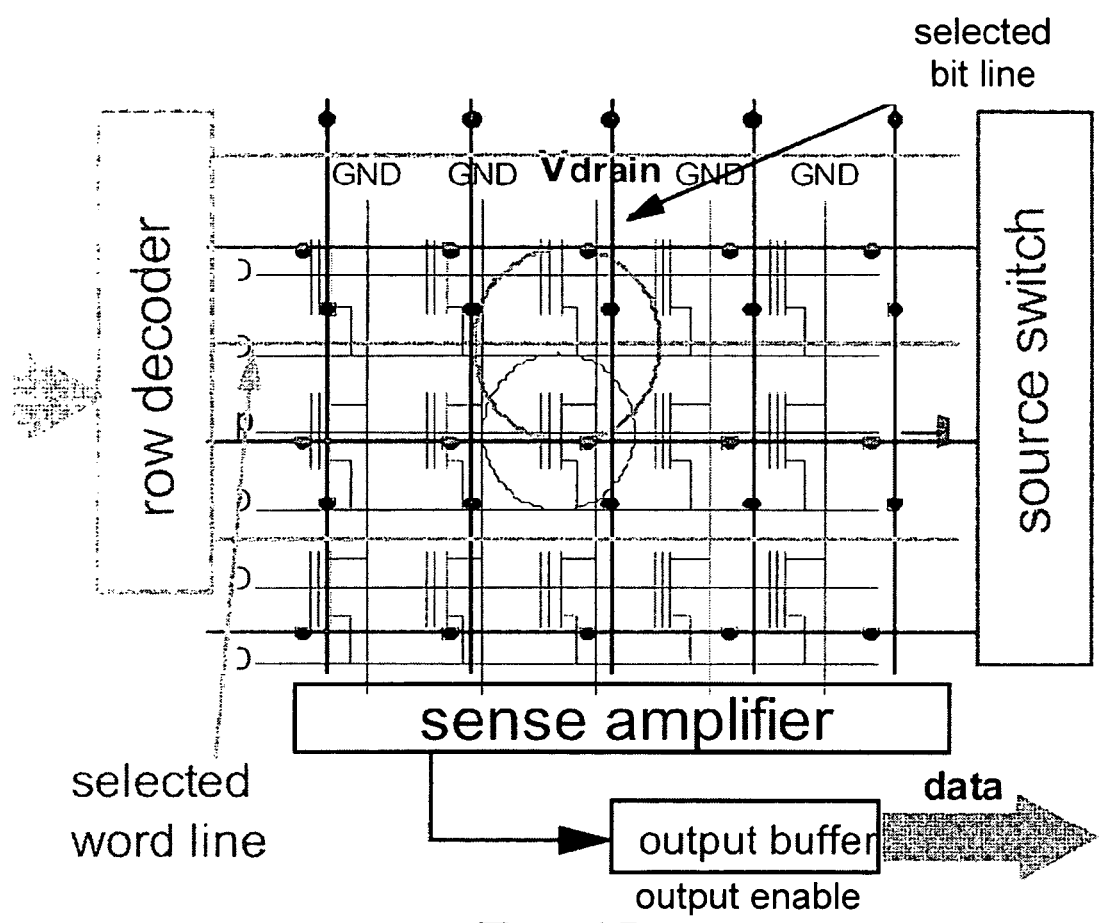
FIG. 15 shows a basic diagram of a NOR array architecture.

The phenomenon of depletion is dangerous in a NOR array architecture because as may be noticed by observing a typical NOR array architecture depicted in FIG. 15, if a depleted cell is present on a bitline it produces a current contribution even if disabled, which may falsify the reading of programmed cells present on the same bitline to read of 1 instead of 0 and thus an undue fail recognition. This is why the cells must be verified after erase operation and eventually soft programmed to ensure that they are above DV reference level. Soft programming is similar to a normal programming but the program pulse width and the soft programming gate voltages are much lower compared to the conditions used during normal programming. However, the same DV reference cell is used as a reference also during this soft programming phase.

At the end of whole erase operation, all the cells of the sector will have a threshold confined between the DV and the EV references. Commonly, reference cells are Flash cells formed close to the memory cell array and are contained in a minuscule array. With present fabrication technologies, this permits to achieve a sufficient match in terms of geometrical and electrical characteristics between the flash cells of the memory array and phase of reference cell array. These cells are accessible for programming & read operations singularly, however during erase, they are erased all together. In ultra-violet (UV) condition, all the reference cells have a threshold that is statistically distributed according to a Gaussian law with mean value $V_{RCUV}$. Target values of threshold for the four reference cells mentioned above are determined through a characterization that is done during the phase of process and cell development.

Since all the cells at beginning are at UV threshold, they must be erased and programmed to the desired levels during the EWS (electronic Wafer Sort). In particular, for the depletion reference cell that has a threshold of about 0.6–1V, erasing must be performed before starting to program the others. As said earlier, the erasing of the reference cells is performed in parallel and thus this operation causes all the cells to erase up to the DV reference level. Therefore, after the erase operation, the programming of each of the reference cells is performed by programming one at the time, as will now be described.

Programming of the reference cells is done in a similar fashion as it is done for the Flash cell of the memory array. However, verification of the correctness of the threshold is done through a direct measurement technique called DMA. DMA (direct memory access) includes applying a fixed voltage to the reference cell gate and measuring the current sunk by the cell while maintaining a fixed voltage (e.g. 1V) on its drain. This is done by accessing the drain of the reference cell directly through the tester PMU (parametric measurement Unit) and measuring the current sunk through it. Of course the path between the cell drain and the PMU is enabled by activating relative test-mode latches.

The PMU is a measurement unit that is commonly available in memory testers that is capable of forcing a voltage to measure the current sunk or vice versa. The PMU is an expensive hardware resource and can be connected to any of the test channels. However when planning to use the PMU on a test channel, that channel must be disconnected from the normal pad electronics of the tester (for driving CMOS or TTL logical levels) by using mechanical relays. This intervention, if not performed in the right sequence, may cause the "hot" switching of relays and damage the tester's pin electronics and the device under test itself. Therefore, PMU connect/disconnect sequences require resetting the device pads to a predetermined standard condition (that may be design dependent, normally at 0V) before connecting/disconnecting the PMU. Moreover, after the PMU has been connected to a cell, it has to force a predefined fixed voltage (1V) on the cell drain and make sure that the voltage level is stable before carrying out the current measurement. It is evident that a considerable time is taken by these conditioning phases during the verify operation. Usually these wait times are larger than the programming time and these delays when multiplied by the number of reference cells to be checked, became significant.

Figure 16:
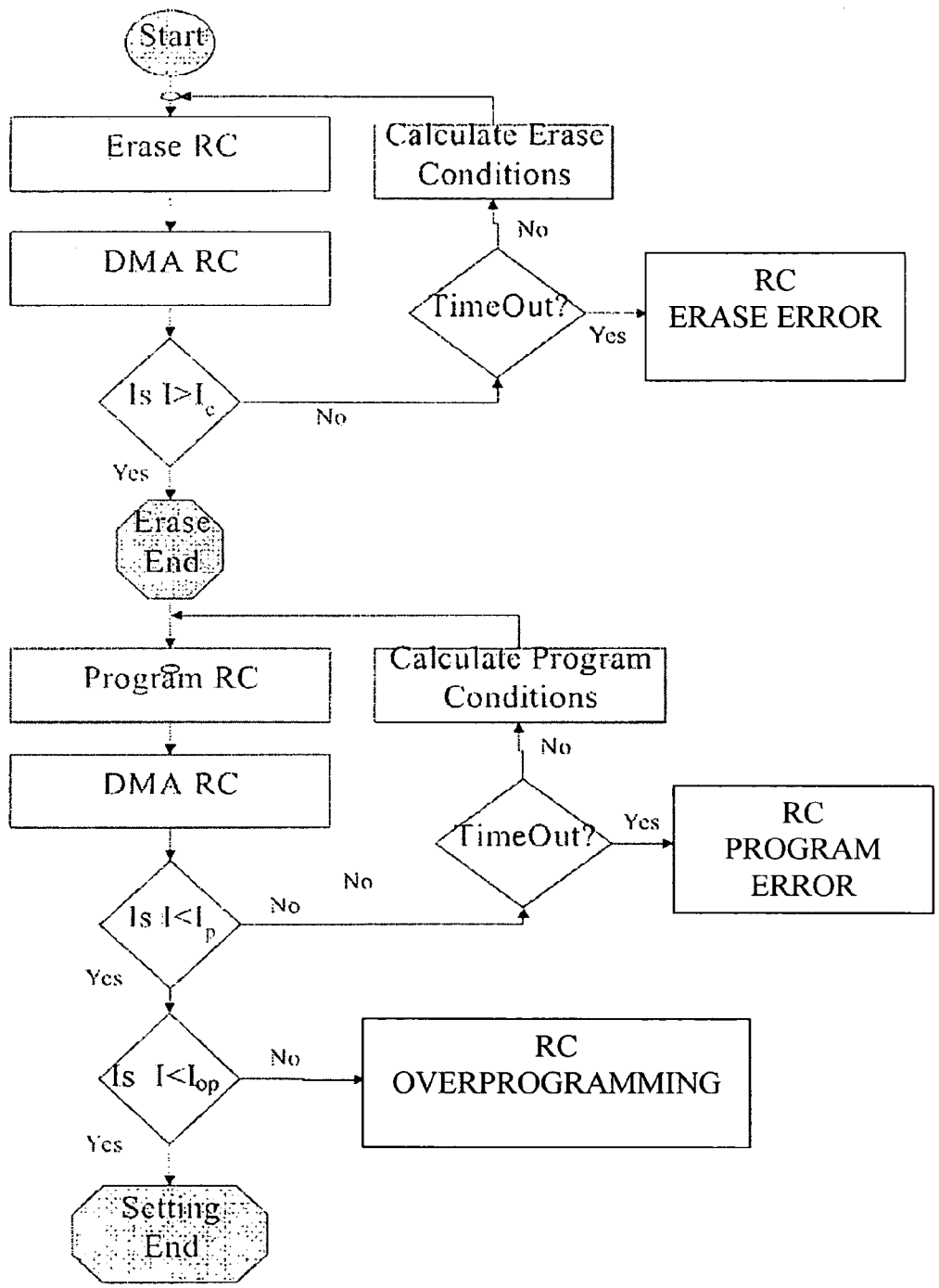
FIG. 16 is the flow chart of the process for setting the reference cells.

The flow diagram of FIG. 16 illustrates the test flow sequence of reference cell setting. The first phase is an erase step followed by a DMA check after each erase pulse whereby the pulse width to be used for the next erase pulse is calculated in function of the "distance" from the target value Ic. In case the number of erase pulses (or the erase time) exceeds a predetermined value (Erase Timeout) an error condition is signaled.

The second phase as said above, is the programming phase of the selected cell, each program pulse being followed by a program verify step that determines the successive pulse in function of the "distance" from the target value Ip until the current measured is less than Ip. Thereafter, a check phase includes checking for eventual over programming, i.e. if the current of any of the cells is less than Iop (min allowable current value for that reference) an over programming error is signaled.

It is evident, how such an extended use of a PMU for setting the reference cell is overburdening in terms of the time taken. According to this known approach the setting of all the reference cells may take from about 1s to 3s depending on design, fabrication, technology, program and erase efficiency.

Figure 17:
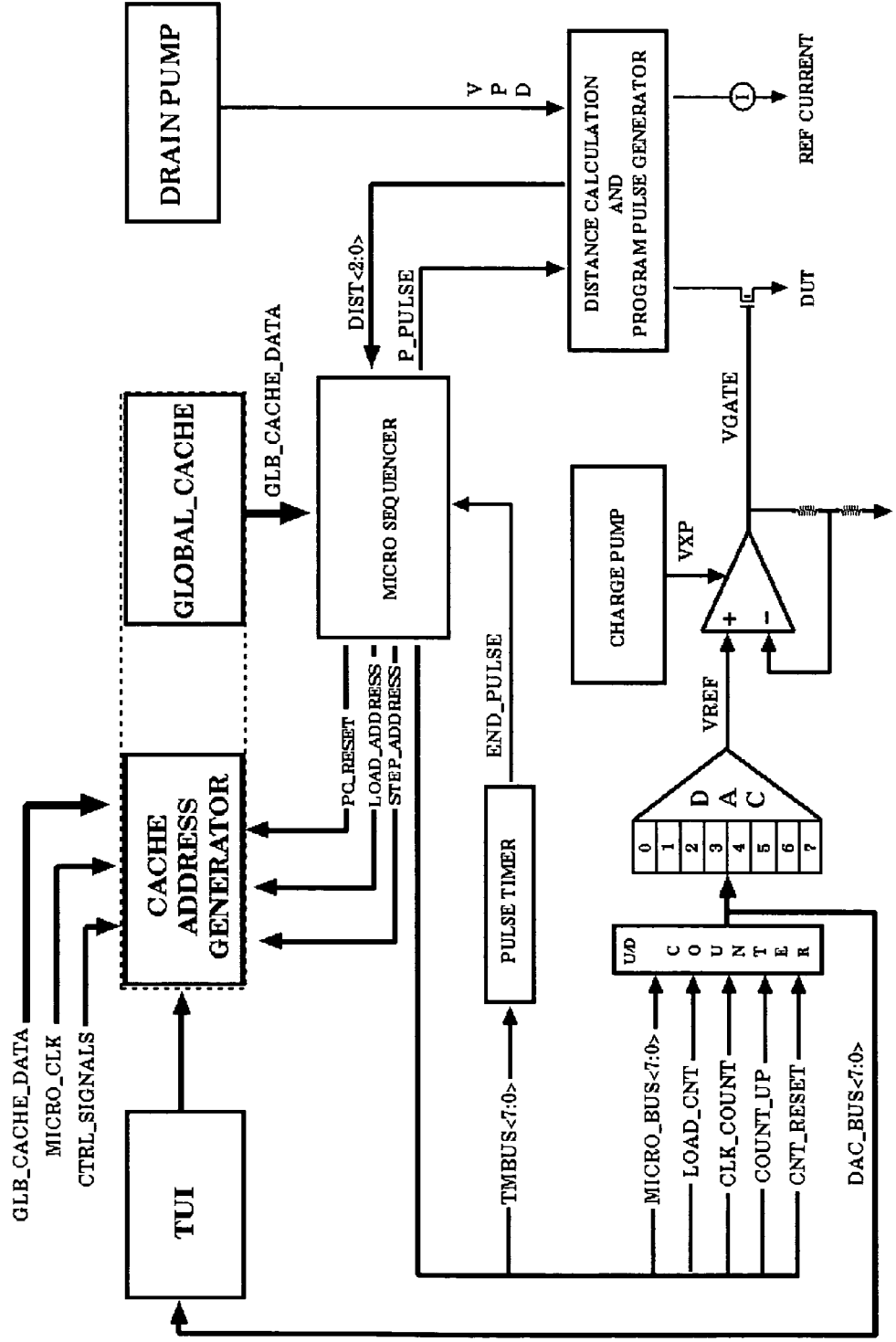
FIG. 17 is a block diagram of the architecture for built-in reference cell setting.

According to an important aspect of the present invention, the time necessary to set the reference cells is reduced by almost 90% by avoiding recourse to a DMA technique using external testing implements. The built-in architecture of this invention for performing reference cell setting internally is in shown in FIG. 17. The setting of the reference cell according to the flow chart of FIG. 16 is implemented by exploiting the embedded micro sequencer (MICRO) capable of reading the necessary data either from an embedded ROM or from a cache, e.g. GLOBAL_CACHE.

The architecture is realized by the following fundamental blocks. MICRO SEQUENCER—The process to be executed, that is the reference cell program/erase sequence is controlled by an instruction sequencer MICRO SEQUENCER. The micro sequencer provides also to adapt the program pulse duration and the program gate voltage in function to the distance between the threshold of the reference cell being programmed and the target value. Also during erase the step, the micro sequencer uses a similar process for adjusting the erase pulse duration and the involved analog bias voltages.

GLOBAL CACHE AND TUI—The global cache is used to download the program/erase program and for reading the instructions during execution. The program may be loaded into the GLOBAL CACHE through the test user interface TUI.

CACHE ADDRESS GENERATOR—This block is used for the generation of addresses both during the downloading of processes through the TUI and during program execution by the micro sequencer.

DRAIN PUMP/VXP PUMP—These are the charge pumps that are used to supply the drain and gate programming voltages.

DAC—It is a digital-to-analog converter that generates a reference voltage (VREF) used for regulating the programming gate voltage.

U/D COUNTER—Is a up/down counter that supplies the DAC with the target value of VXP regulation in digital form. The counter interfaces with MICRO and TUI and is used by the micro sequencer to set the correct levels of VXP gate voltage according to the process demands.

PULSE TIMER—Is a time counter instructed by the MICRO to generate program pulses of the required duration.

DISTANCE CALCULATION AND PROGRAM PULSE GENERATOR—Is the current that perform the measurement of the "distance" of the current sunk by the reference cell being programmed from the target reference current value. The measured difference is digitized and fed back to the MICRO for appropriate actions. Moreover, this block establishes the connection between the source of the programming drain voltage VPD to the drain of the reference cell being programmed during a program pulse.

The architecture includes means to obtain the information regarding the actual cell threshold distance from the pre-defined target value in a digital form and uses it to adapt the duration of the program pulse and the programming gate voltage for an eventual successive program pulse. The architecture provides outstanding flexibility by allowing the downloading of any programming/erase process in the GLOBAL CACHE and does not require the use of external PMU for performing the necessary current measurements. The latter are performed, using either an internal or an external reference current, by a distance (difference) calculation circuit. Elimination of the need to use a PMU makes the operation extremely simpler and efficient.

Internal Addresses De-scrambler

Usually the internal addresses of a flash memory are scrambled for several technical reasons. For purposes of this invention, the target is to have a linear column/row address arrangement. This means that "row0/col0" correspond to row/col address "0", row1/col1 to row/col address "1" and so on, row-n/col-n to address "n".

During EWS testing, a fail map is generated on the tester catch memory. The analysis of this map is very important to gather information about eventual fabrication process problems. These fail maps may evidence a characteristic aspect, said "defect signature", that helps the device engineer to recognize problems and eventually solve them. Nowadays, memory addresses are given in a topologic manner using an external memory, called "Scrambler memory", present in the tester. This memory links the addresses produced by an internal counter of the tester with the external addresses of the memory to obtain a biunivocal correspondence between successive address values generated by the tester counter and the physical columns of the memory array of the device being tested.

The content of the scrambler memory is a firmware that is written on specific requests thus an additional constitution cost. The firmware changes from a device to another and, for every new device, a new scrambler firmware must be procured. Even this drawback is overcome by the present invention.

Figure 18:
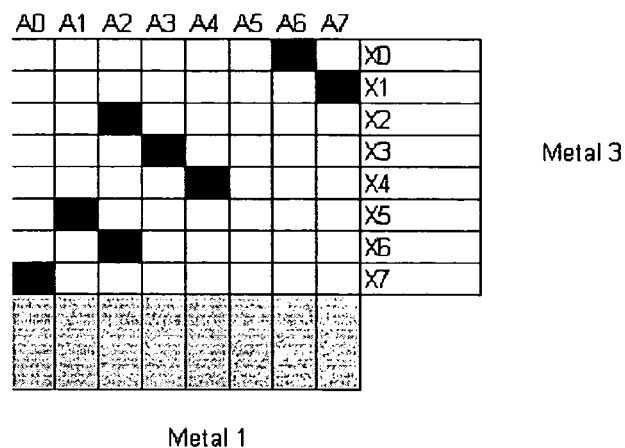
FIGS. 18 and 19 illustrate the architecture employed for internal addresses de-scrambling.
Figure 19:
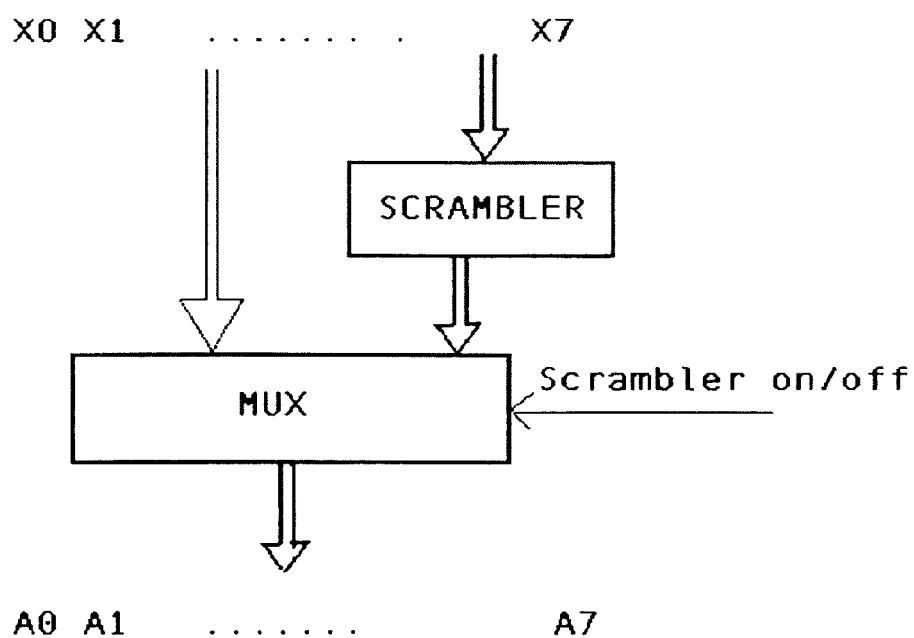

The approach is based on the use of a two metal layers matrix (for example realized in Metal1/Metal3) as shown in FIG. 18. These metal structures are connected together through bias in correspondence of the addresses that must be scrambled (i.e. establishment of correspondence between topologic address and electrical address). The approach is easy and has a low cost. It only needs single logic circuitry to switch from standard mode to scrambler mode, as shown in FIG. 19. The great advantage is that only one "linear" scrambling firmware will suffice for a particular tester. The same firmware will be usable for testing any new memory device.

Internal Process and Hardware for Vgmax/Vgmin Testing

During EWS testing the limit in read functionality when changing the actual bias voltage on the array wordlines must be assessed. Such limit voltage, in reading "zeroes" and "ones", are defined as Vgmax and Vgmin respectively. These read thresholds are characteristic of each single device: Vgmin is the maximum supply voltage at which all cells are correctly sensed as a logic "one"; Vgmax is defined as the minimum voltage at which all cells are correctly sensed as logic "zero".

The testing routine defines two voltage ranges in which the two above defined parameters, (vgmin/vgmax), must remain. If this is not satisfied a fail flag will be generated and the part will be rejected. According to the known practices, during EWS or FT testing, pattern All0/All1 is programmed on the whole memory array. This as well as the successive search of the limit values of vgmax/vgmin are executed by external means. The use of an external testing machine implies long testing times.

In fact, read operations of the whole matrix are done with a minimum cycle time of about 250 ns (almost 2.5 times longer than the typical access time of the slowest flash memory devices) because the testing machine must compare the read data with those written in the same location in a "tester reference memory" to validate each read (pass/fail). Also to this drawback of the known approaches, the built-in architecture of this invention provides an efficient approach.

This is achieved by adding few lines of code to the firmware of the embedded micro sequencer and by exploiting some functional blocks that are normally present in a flash memory device. This results in a dramatic reduction of the relative testing time during the EWS flow, since interfacing requisites with an external testing machine are eliminated. The time saved is directly proportional to the size of the memory array under test. Furthermore the simplicity of the internally executed routine facilitates test program development and debug phases while not incrementing the number of gates (silicon area) of the design, since all the circuitry that is used already exists in the device.

Figure 20:
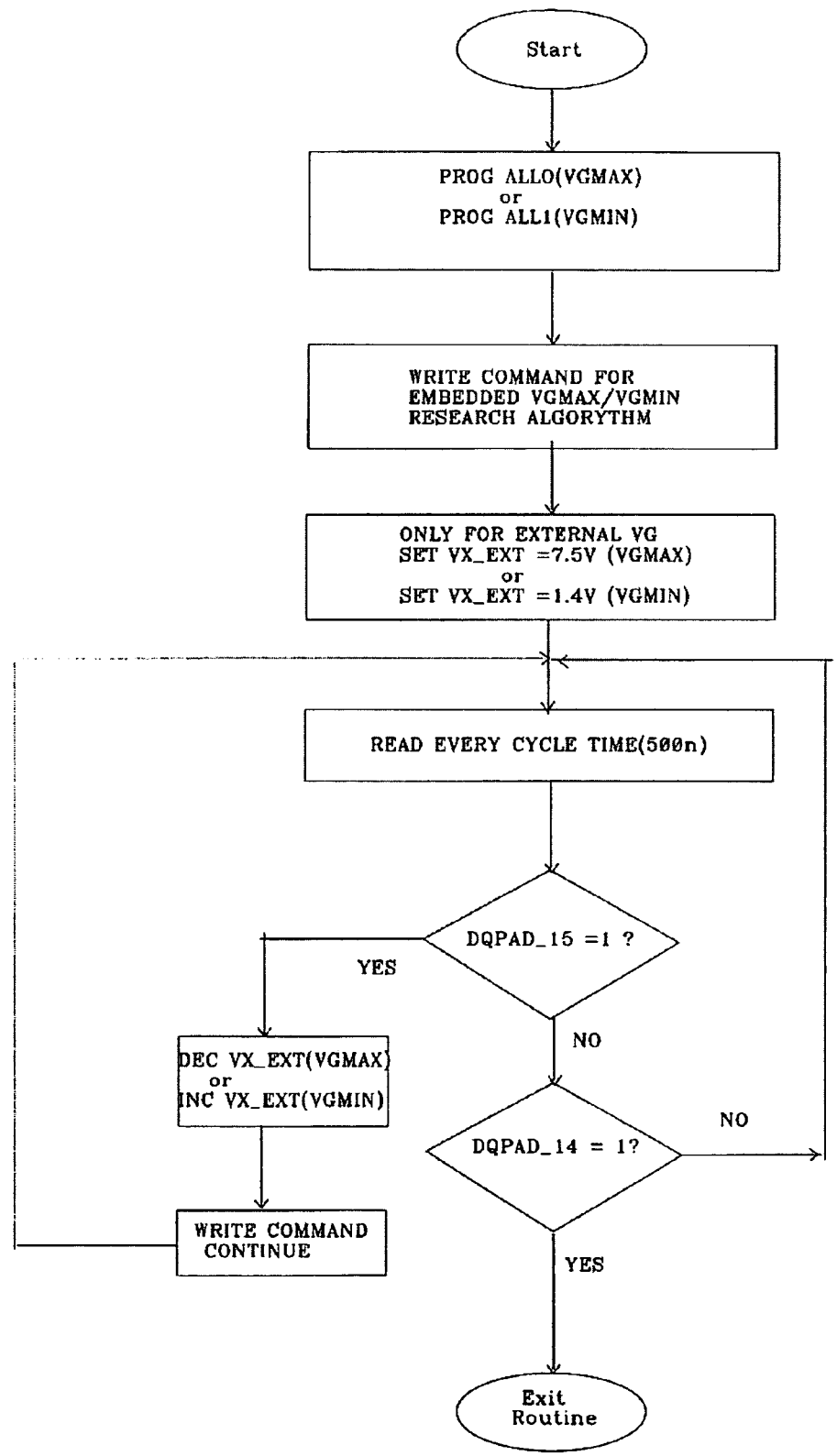
FIG. 20 is a flow chart for searching VGMAX/VGMIN values.

The flowchart of FIG. 20 starts from a programmed/erased device to search vgmax/vgmin values. Successively, the test program through the TUI issues a command sequence to begin embedded vgmax/vgmin search, following with an internal or an external approach. According to the command, the supply voltage is set to 7.5V (for vgmax) or to 1.4V (for vgmin). Thereafter, the program commands a read every 500 ns, checking values present on DQPAD_15 and DQPAD_14.

Figure 21:
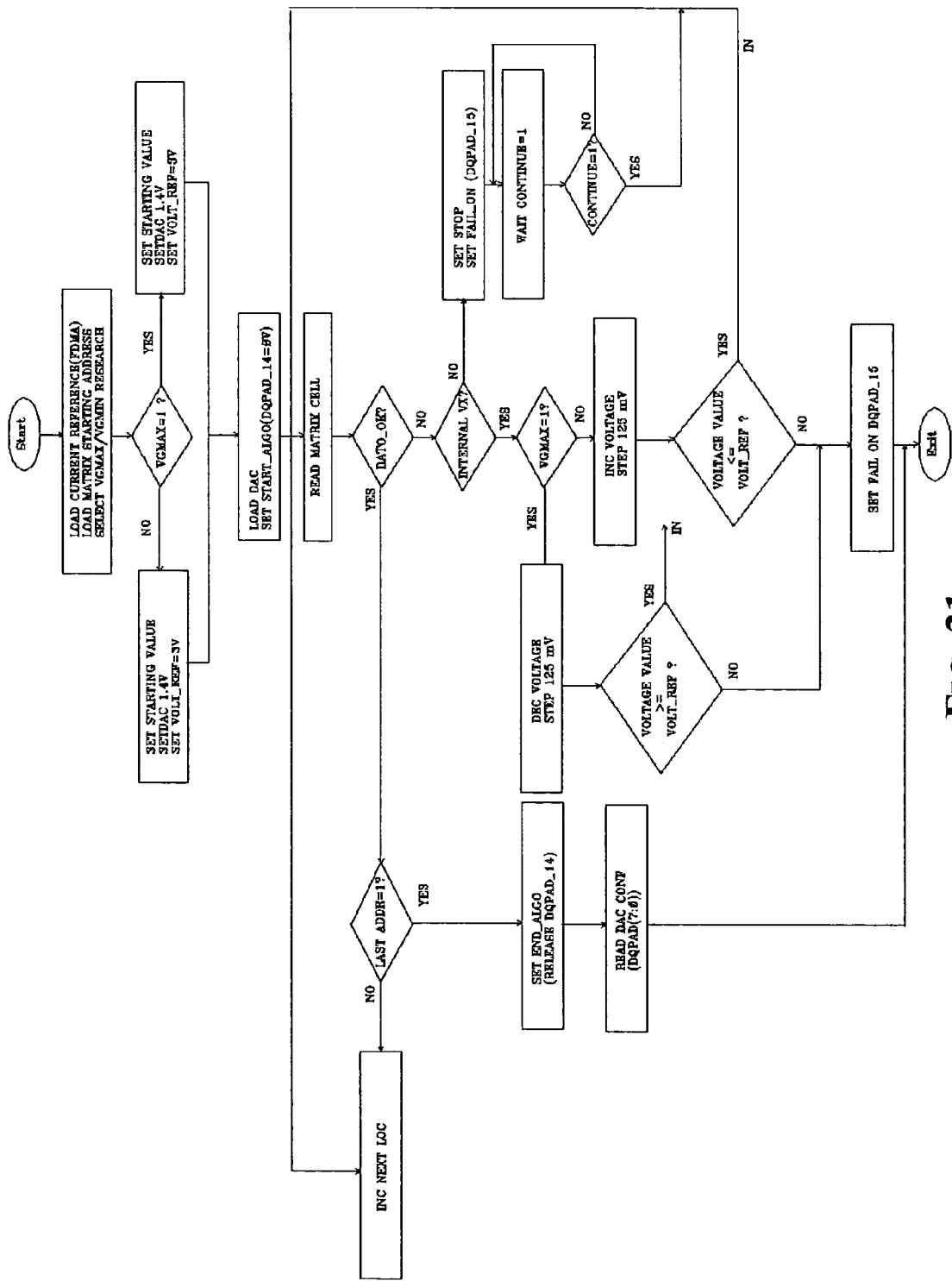
FIG. 21 is a flow chart of the internal process used by the microprocessor to execute the binary search.
Figure 22A:
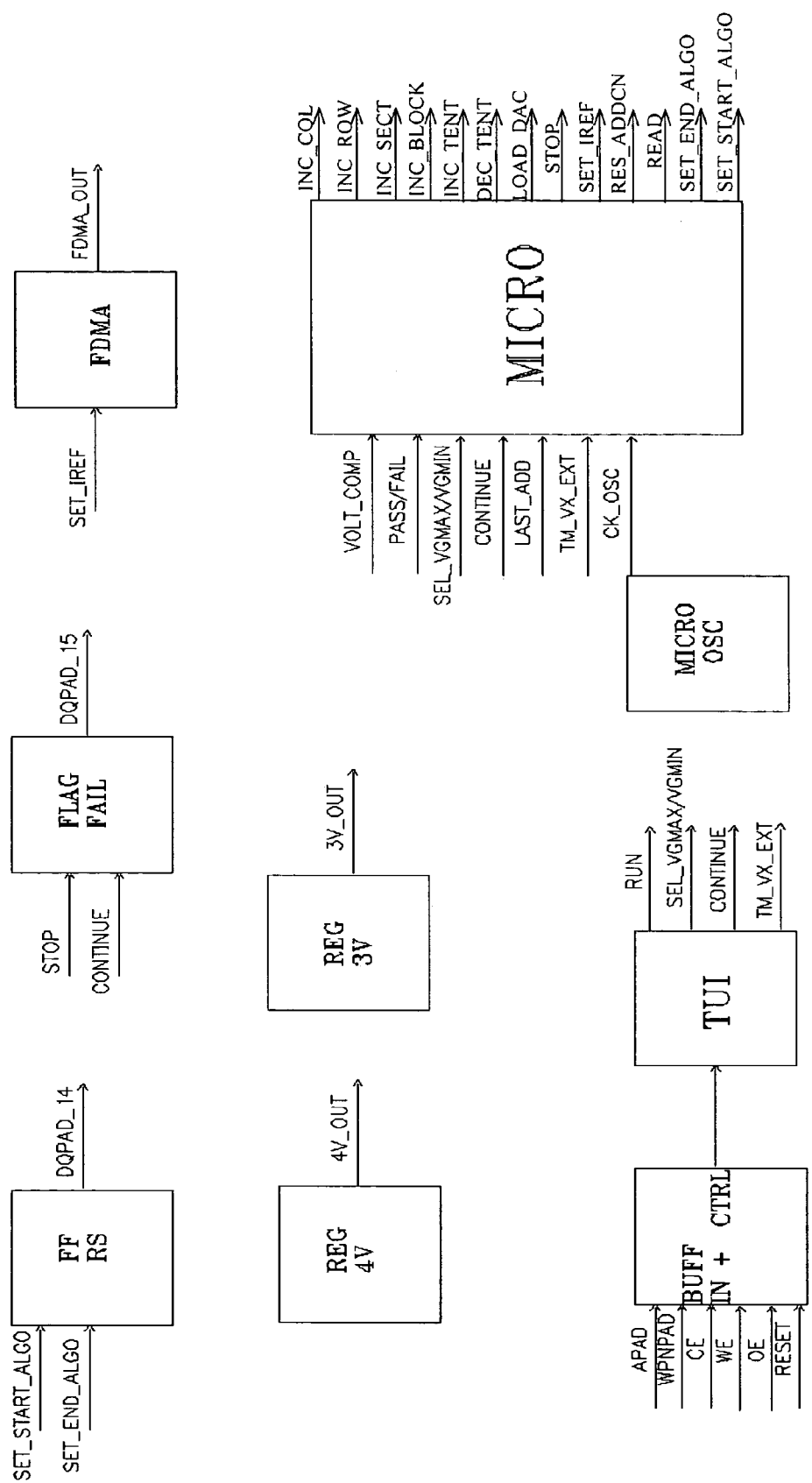
FIGS. 22A and 22B are function diagrams of the hardware for testing VGMAX/VGMIN according to the flow charts of FIGS. 20 and 21.
Figure 22B:
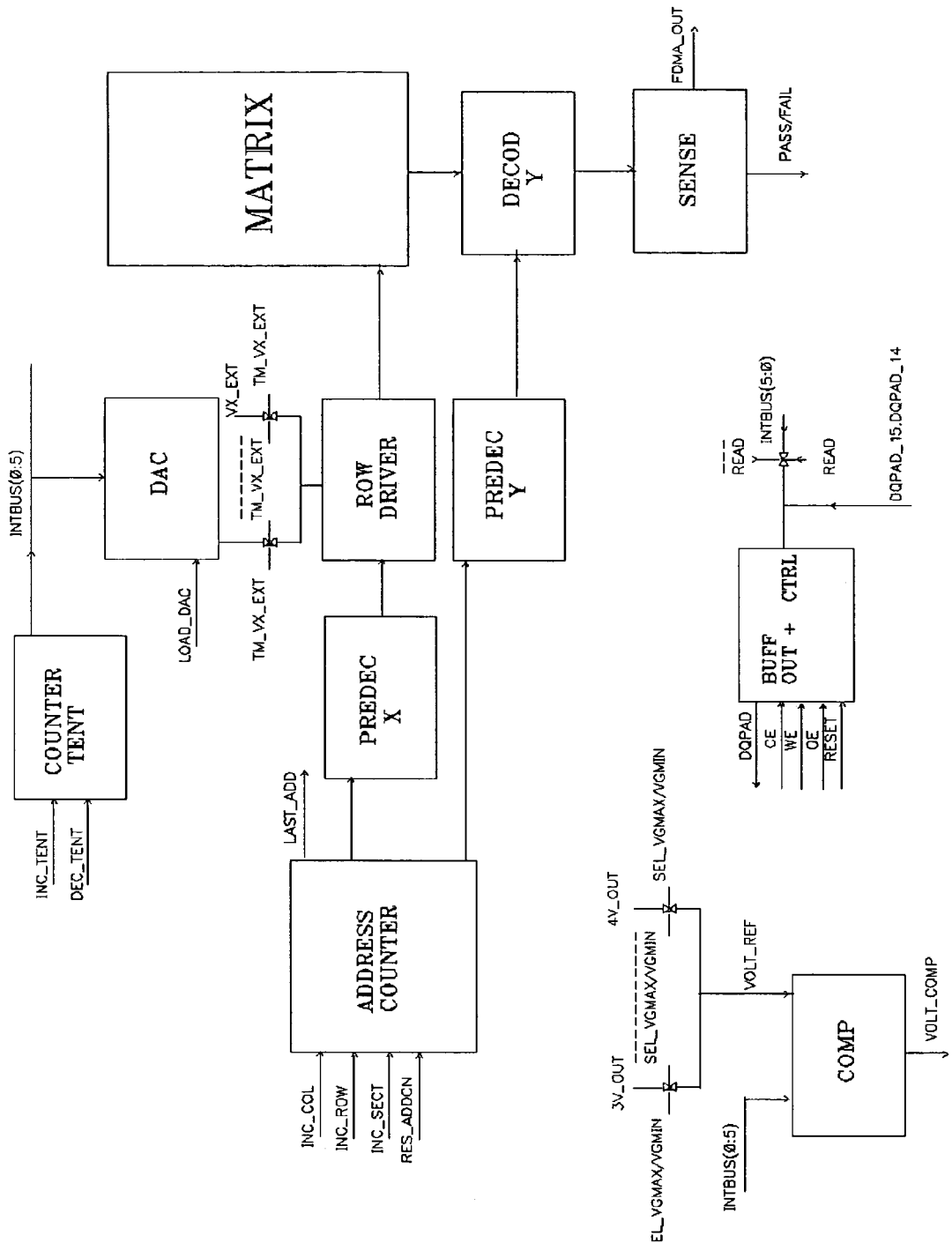

As illustrated in the flow chart, depending on the values present on the DQ pads, it will be decided to repeat read or to change value of the externally driven gate voltage (wordline bias voltage). In the latter case a further command will be issued to proceed with the read operations. If DQPAD_14=1, execution of the process will stop and the search will end. The flow chart of FIG. 21 shows the internal process that is executed by the microcontroller to carry out the binary search. This flow chart is linked with the block diagrams shown in FIGS. 22A and 22B.

The flow starts with the loading of the reference current using fdma blocks, and with selecting vgmax or vgmin search in dependence of the sequence command sent to TUI from the test program. The starting address location will be set always to 00 . . . 00. Depending from the value of the "VGMAX" flag, set by TUI, a certain voltage value is loaded on the DAC to start the binary search. This value is chosen in the voltage range 7.5V–1.4V. The reading of array cells can now start with an internal x64 parallelism.

The next step is to check the "DATO_OK" flag: if the flag value is equal to '1' the process proceeds to read next location. If the value of the "DATO_OK" flag is equal to '0' the process checks the value of the "INTERNAL_VX" flag. If the value of this flag is equal to '1' the process checks the value of the "VGMAX" flag to change the gate array voltage. The new value of gate voltage is obtained using DAC circuitry and the counter "COUNTER TENT". When the process issues an INC_TENT or DEC_TENT command, the value of this voltage is increased or decreased of about 125 mV (see also FIGS. 22A and 22B).

If the value of new gate array voltage is greater (for vgmax research)/smaller (for vgmin research) of a voltage reference (4V for vgmax/3V for vgmin search) the process continues to read starting from last address fail. If the value of the flag "INTERNAL_VX" is equal to '0', the process sets the signal "STOP" to '1' and places on DQPAD_15, a '1'. From this moment on, the process goes to stand-by and will resume when the external command "continue" will be sent to TUI, and the flag CONTINUE will be set to '1'. When this command arrives, the process will resume, from the last fail address, the read operations.

If the new voltage value is out of the limit value, a flag FAIL is set on the DQPAD_15 and the execution of the process ends. At the end of the process, established by the value of DQPAD_14, if no errors have been found (this is done by reading the value of DQPAD_15), the value read on DQPAD[5:0] is the searched voltage value.

The system of this invention permits to do an automatic search, on a memory flash programmed with a pattern all0/all1, of the gate voltage value at which a logic one or a zero are correctly sensed. A reduction of the test time by about 67% with respect to commonly used search method is obtained. A simplified test flow debugging is another attendant advantage.

The architecture of this invention is outstandingly flexible because the voltage supplied to the cells for the read operations may be generated either by an internal DAC or by an external supply. An internal DAC is able to change accurately the applied voltage by 125 mv steps, while the micro controller can manage a linear search of the pass/fail points during read operation of the memory. Thus the system permits fast reading operations of each memory location reducing the testing time.

Figure 23:
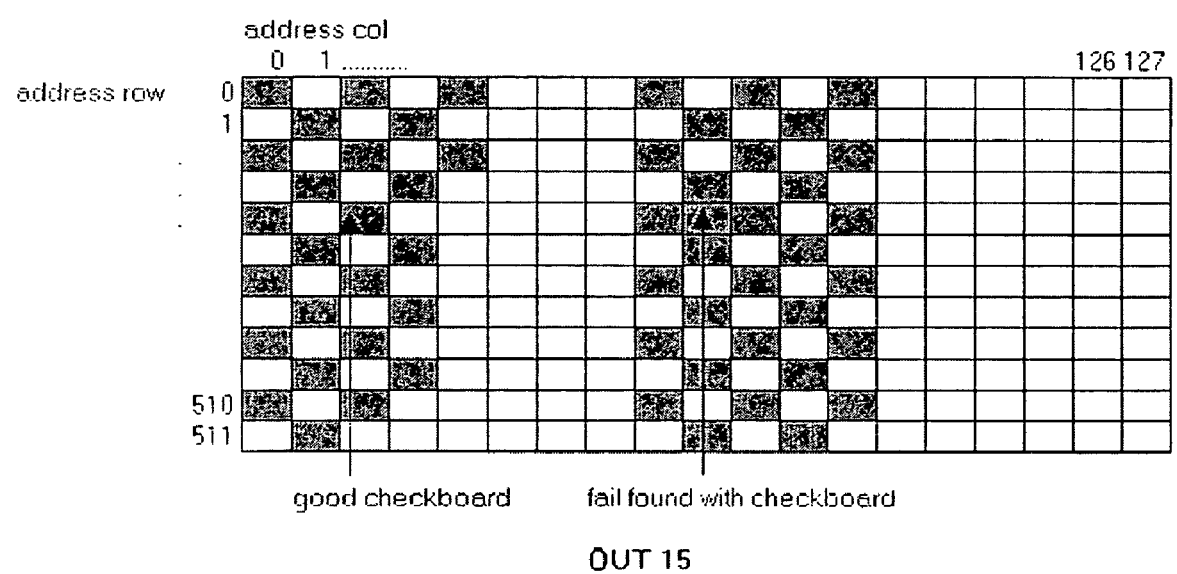
FIG. 23 shows the checkerboard patterns programmed for testing the memory array for the presence of shot circuit or other defects.

Internal Hardware and Process to Program an All0/All1 Checkboard Pattern on Memory Array During EWS or FT test phases memories are programmed according to special patterns called "checkerboard" (ffff/0000, aaaa/5555, and the like as shown in FIG. 23). The programming of these patterns allows an easy detection of shorts between adjacent cells or shorts between selection transistors in the decoding structures. According to the built-in system of this invention, data to be programmed on successive locations are generated automatically inside the device as well as the correspondent addresses.

The system overcomes the burden of writing consecutive user mode program commands for each location and significantly contributes to reduce the testing time. The saving of time is directly proportional to the size of the memory array under test. Moreover, the simplicity of the routine greatly helps the test program development and its debugging, while not incrementing the number of gates (silicon area) of the measuring device. In practice the system permits automatic programming of any "single-word" starting from whatever word address and whatever data entered as data input, using an embedded process.

In fact when using an external tester the interfacing problems of transmission lines of the input/output channel must be taken care of. To do so it is necessary to use a relaxed timing in writing command to be sure that the address and data bus are stable. Commonly the timing is of about 200/300 ns cycle time.

Considering that any single-word program command includes four cycles and considering that the internal time requested to program a word is about 8 µs, this means that almost 10% of the programming time is used to send the unlock and command cycles to the device. In the table below are reported the timings that resulted from a comparison between a standard program routine through the external tester and an internal routine according to this invention for three different memory sizes.

| Size of memory | Programming time for entire matrix using standard approach | Programming time for entire matrix using standard approach |
| --- | --- | --- |
| 16 Mbit × 16 | 13920 ms | 8400 ms |
| 32 Mbit × 16 | 27840 ms | 16800 ms |
| 64 Mbit × 16 | 55680 ms | 33500 ms |

Figure 24:
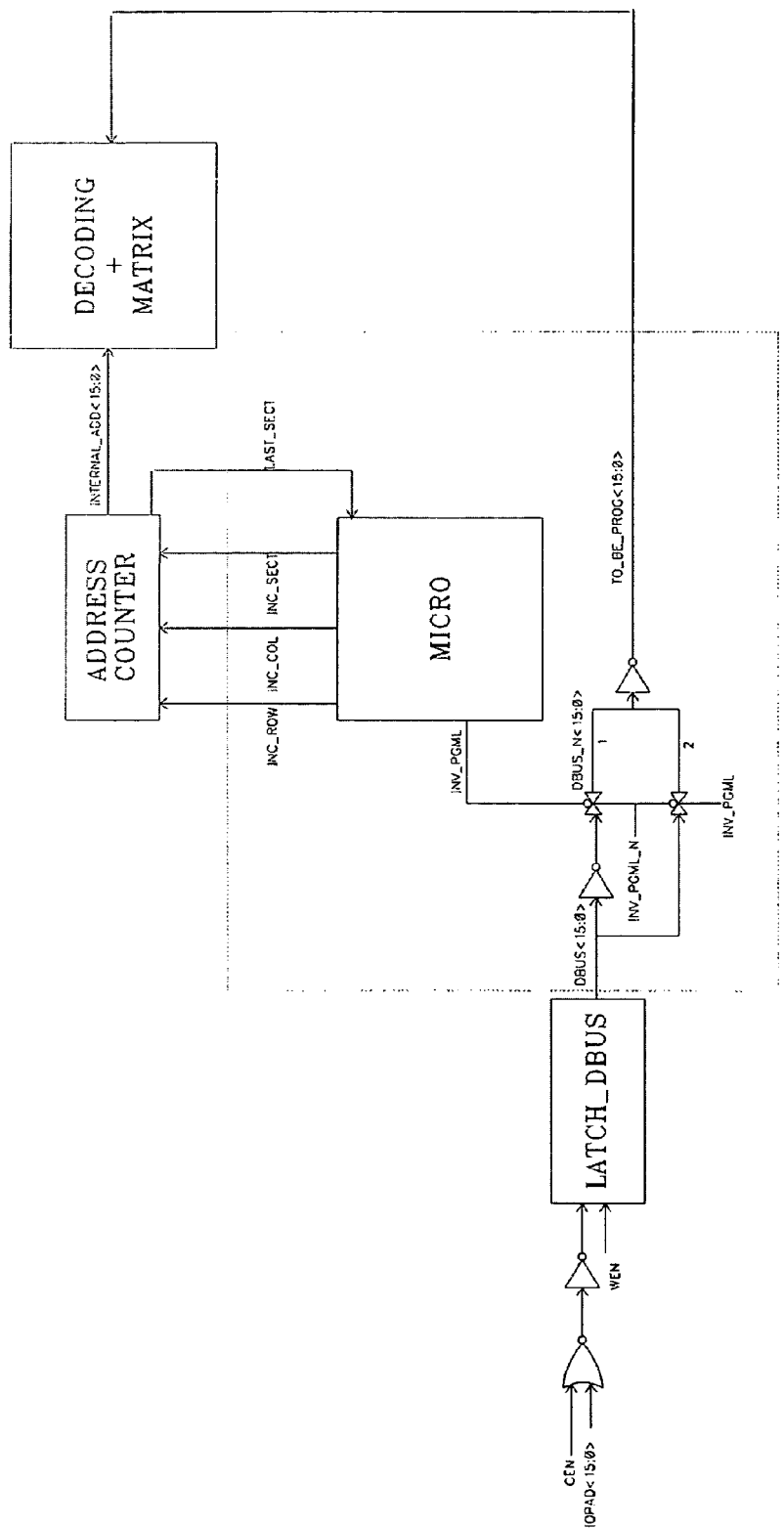
FIG. 24 is a hardware block diagram of the structure use for performing the internal process of programming All0/All1/checkboard pattern on the memory array.
Figure 25:
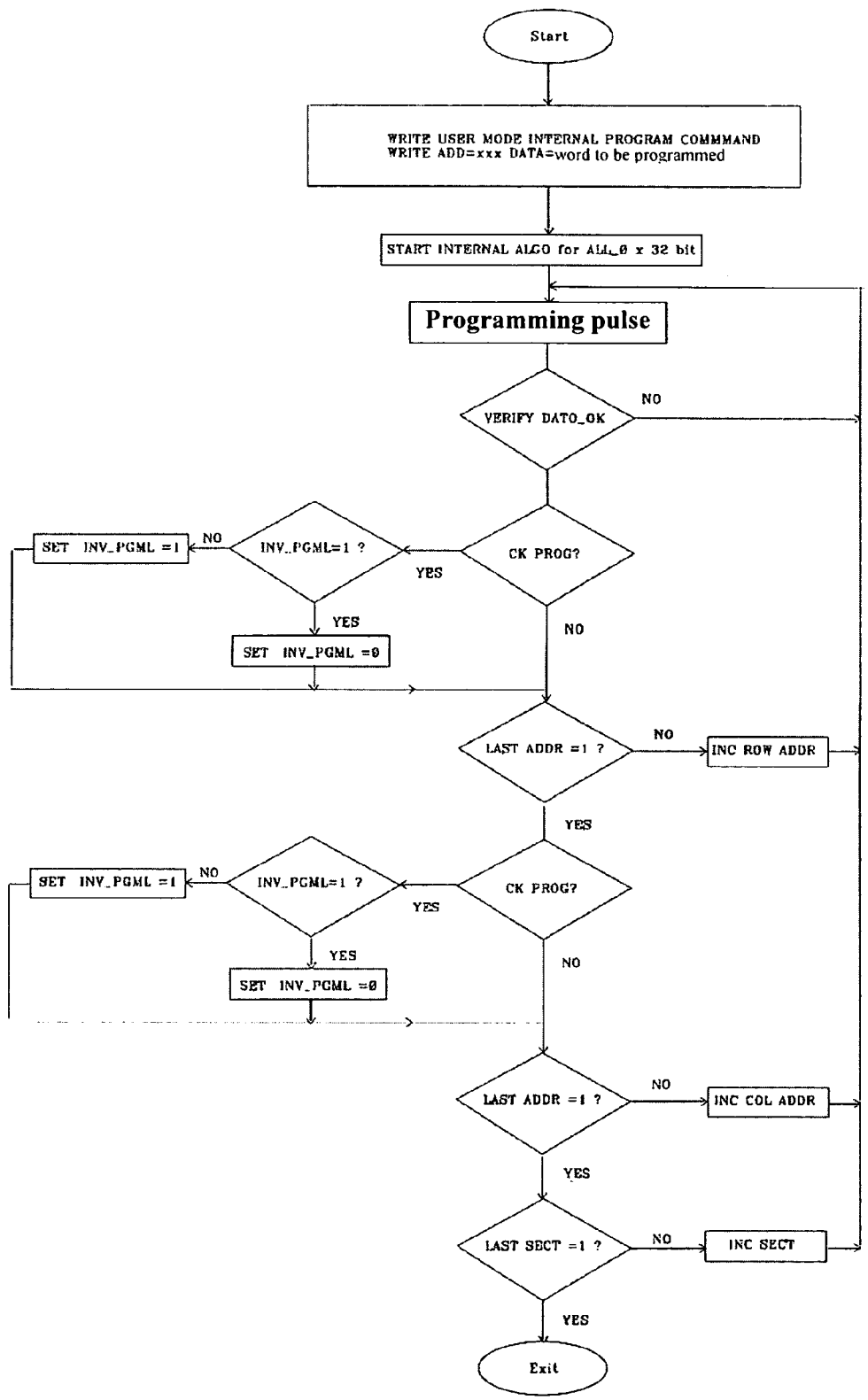
FIG. 25 is the flow chart of the checkerboard pattern programming.

The hardware structure that is implemented is illustrated in the diagram of FIG. 24, and FIG. 25 is the flow chart that illustrates the embedded process that is internally executed by the MICROcontroller. The test starts with a command cycle for embedded programming, sent to the TUI, followed by a write cycle to load the data that the user wants to program in the array (ffff, aaaa, 0000, ff00, etc). The process starts on the raising edge of the last write cycle. Depending on the command sent to TUI, the embedded process will program a CK, a CKN or an ALL0/ALL1 pattern.

When the process starts, a programming pulse is sent to the addressed memory cells and, at the end of an internal read phase, verifies if the datum is correctly programmed.

After the verify operation has passed, the micro-controller checks whether a ck, ckn pattern, or an all0/all1/diag pattern is requested to be programmed and then waits for the flag value "CK_PROG". It should be noted that to program a ckn pattern instead of ck, it is sufficient to load the complement of the ck pattern at the last write cycle. The value of the "CK_PROG" flag may or may not be set by using two different command sequences depending on the pattern to be programmed whether Ck/Ckn or All0/All1.

If "CK_PROG" is set, the process checks the value of another flag "INV_PGML" and then inverts its state. This flag (see FIG. 24) changes its value at each consecutive programming pulse thus realizing a real CK pattern inside the array. The process also recognizes if the last column address has arrived and changes twice the value of flag "INV_PGML" to continue the correct sequence of a checkerboard matrix (see FIG. 23). If "CK_PROG" is set to zero then, by the same process, an all0/all1 pattern is programmed depending on the value loaded on data during the last write cycle.

The system described above permits to do an embedded programming operation of any pattern on the cell matrix, by loading data to be written during the last write cycle. This is done substantially at no costs in terms of area. In practice, only few more inverters are needed and few more lines need to be added to the micro-controller code. This approach reduces testing time during programming operations and the saving may even be enhanced by increasing the word programming parallelism (that is passing to x32 or even to x64 bits).

Analog Voltage (or Current) Measurement in Digital Form

Analog node voltage measurement is indispensable to provide device voltage level information. The same information and relative test methodology may of course be used for current measurement. This is achieved both taking care of measure precision, that can be then modified by the user depending on his needs, and implementing a simple codification method to encode in a digital format the analog voltage level.

The built-in analog voltage (or current) measurement system that will now be described provides digitized information that may be easily gathered by whatever EWS testing machine is used, through normal I/O structures and then processed as a common digital pattern, not requiring any particular analog interface or PMU. The reference voltage can be provided internally by a step voltage regulator driven by control signals sent by the micro-controller in execution of a certain process.

Figure 26:
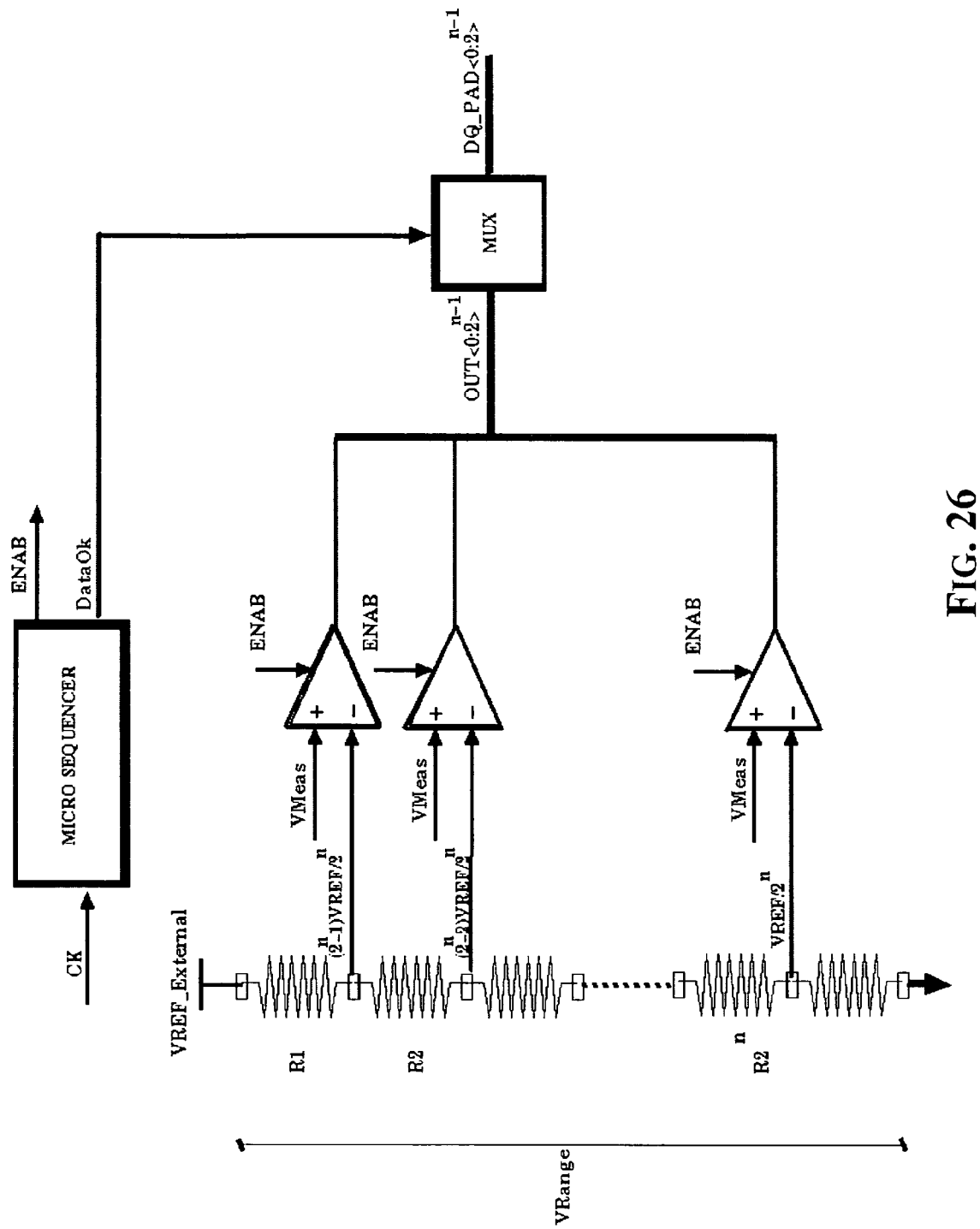
FIGS. 26 and 27 are alternative circuit diagrams that may be used for analog voltage (or current) measurement in digital form.
Figure 27:
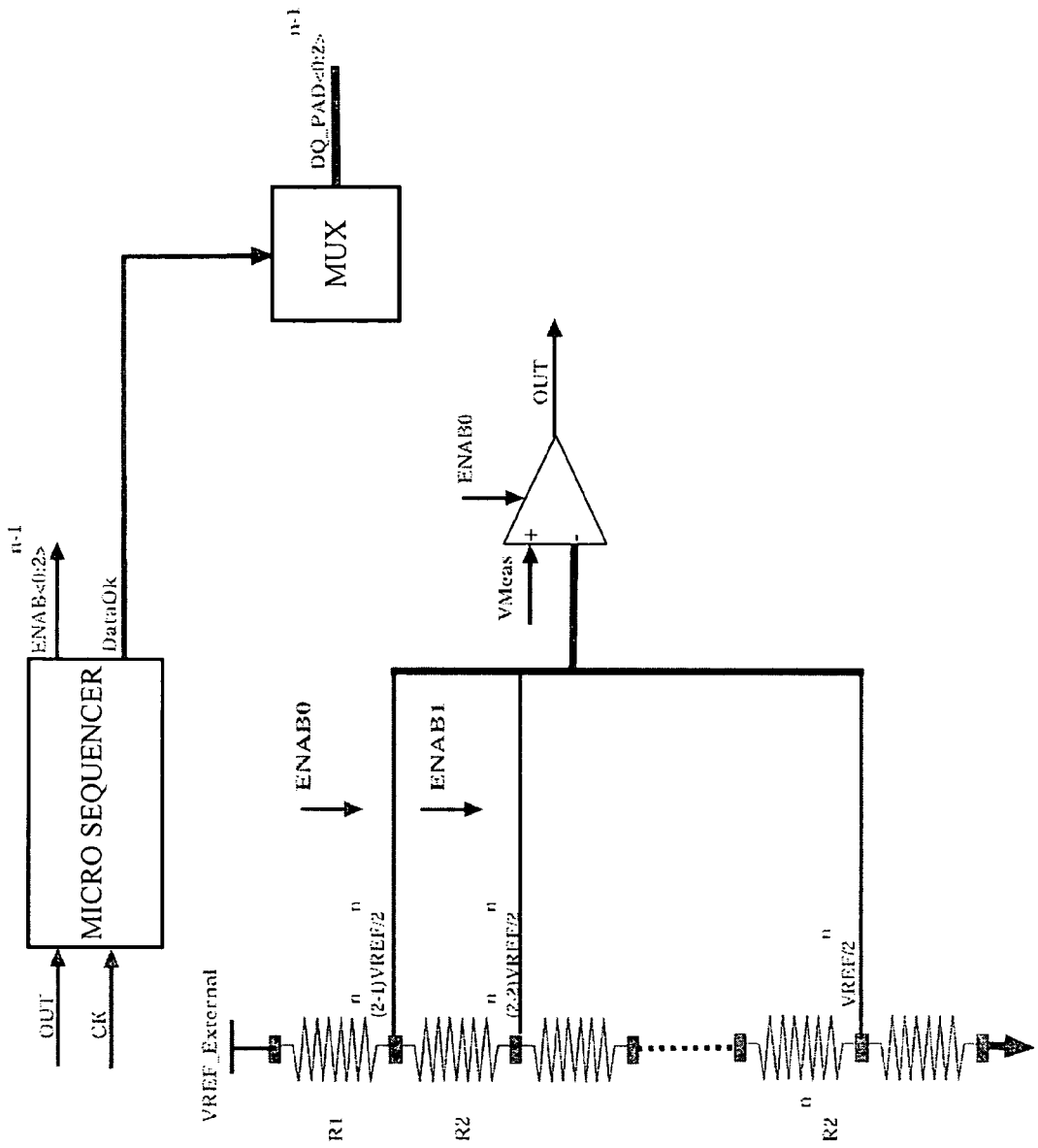

The approach followed by the present invention includes a detector of the analog voltage in a specific and discrete range of voltages, according to the scheme shown in FIG. 26. An alternative embodiment is illustrated in FIG. 27 in which the number of comparators used is reduced (less silicon area) by accepting a proportionate increase of the measurement time due to the numerosity of successive and distinct measurements to be performed (binary search approach).

With a scheme as that of FIG. 26, the precision is defined by that or the reference and by the number of the comparators, that is the number intervals in which the voltage range of measurement to cover is divided. The larger is the number of intervals the more accurate the measurements will be. Considering the considerable amount of time that would be required for voltage data acquisition through an external PMU of a testing machine, an built-in voltage measurement structure as described above is faster and does not require a codification.

This built-in approach for internal analog voltage measurement in numerical form allows for an efficient debugging of the functionality of main analog circuits used in a memory device such as voltage pumps, WL/BL voltages and the like. It is also helpful for setting the device configuration for EWS during which the operator is overburdened by the work involved for optimally setting all internal reference nodes (Bgap, Iref and others) to accomplish which, according to current practices, he is obliged to derive the required voltage references (10 mv, 50 mv, 100 mv etc) from a master external reference voltage such as the VCC core supply voltage or other external references.

The built-in approach of the present inventors permits accurate current and voltage measurements during the testing routine of whatever device while at the same time reducing testing time in terms of measurement time as well of the time for developing-and-debugging of the test software by the testing machine. For devices like Flash-memories this important result is achieved with a minimum increase of the number of gates and of design time since a large portion of the circuitry needed to support and implement the novel built-in test architecture is already present for other functions in known devices.

That which is claimed is:

1. A memory device comprising:
   a flash memory array;
   a micro-controller for managing flash memory operations, testing of the device at wafer level and as finished product, redundancy analysis, programming of re-routing cams and validation of the device;
   a test mode command interface for coupling with external test equipment;
   a circuit block including a register to store a redundancy vector to be programmed in the re-routing cams and the selected paths for programming information, during execution of a cam programming process;
   the micro-controller comprising a built-in hardware structure for performing predefined routines of testing, redundancy analysis, programming of re-routing cams and validation of the device internally without exchanging data with the external test equipment, the built-in hardware structure comprising
   a first cache memory for storing up to a maximum number N of column addresses of detected failed cells, N being equal to the number of available column redundancy resources for a sector of the memory array,
   an address counter associated with the first cache memory,
   an expected data generation circuit for generating expected data,
   a data comparison circuit for comparing the generated expected data with data read from a certain memory location pre-programmed with the expected data,
   a local data cache defined by a number N of registers equal to the number of column redundancy resources available for each sector of the memory array, each register having a number M of bits coinciding with read parallelism of the memory array, and in which the data comparison circuit writes information relative to the bits on which a failure has occurred,
   a bit position counter for bit by bit scanning of the registers of the local data cache,
   a second cache memory for storing information relative to detected failed array cells, accessed, in reading and in writing, through a first data bus and controlled through at least one of a second bus from the test mode command interface and a third bus from the micro-controller,
   an up/down counter for pointing to one of the registers of the local data cache, to one of the registers of the first cache memory and to a location of the second cache memory and including a latch for preserving a pointer value,
   a cache address generator for generating a current address of the second cache memory based upon a current address in the address counter and the up/down counter, and
   a plurality of bus drivers, driven by control signals managed by the micro-controller, for accessing the first data bus and the second cache memory for writing therein the following information
   the content of the up/down counter,
   information of the position of the detected failed array cells derived from scanning the N registers of the local data cache through the bit position counter,
   the column address of columns with detected failed array cells, and
   control information stored in the second cache memory through the test mode command interface for executing specific test routines.

2. The memory device according to claim 1, wherein the built-in hardware structure of the micro-controller further comprises first and second pointer generators, and a binary adder connected to a multiplexer; wherein the current address in the address counter is provided to the first pointer generator, and the content of the up/down counter is provided to the second pointer generator, and the data output by the first and second pointer generators is combined by the binary adder coupled to a first input of the multiplexer, a second input of the multiplexer receiving an address of a cache memory location through the test mode command interface, for the selection of an access mode driven by an external command signal through the test mode command interface.

3. The memory device according to claim 1, wherein the built-in hardware structure of the micro-controller further comprises a program counter and associated read only memory; and wherein the second cache memory is addressable also through the program counter which provides pointer data to a third input of the multiplexer.

4. A memory device comprising:
   a flash memory array and an associated micro-controller; and
   a test mode command interface for coupling the micro-controller with external test equipment;
   the micro-controller comprising
      a first cache memory for storing column addresses of detected failed cells,
      an address counter associated with the first cache memory,
      an expected data generation circuit for generating expected data,
      a data comparison circuit for comparing the generated expected data with data read from a certain memory location pre-programmed with the expected data,
      local data cache connected to the data comparison circuit for storing information relative to bits on which a failure has occurred,
      a bit position counter for bit by bit scanning of the local data cache,
      a second cache memory for storing information relative to detected failed array cells,
      an up/down counter for pointing to a location of the local data cache, to a location of the first cache memory and to a location of the second cache memory and including a latch for preserving a pointer value,
      a cache address generator for generating a current address of the second cache memory based upon a current address in the address counter and the up/down counter, and
      a plurality of drivers for accessing the second cache memory for writing therein the following information
         the content of the up/down counter,
         information of the position of the detected failed array cells from the local data cache and the bit position counter,
         the column address of columns with detected failed array cells, and
         test control information.

5. The memory device according to claim 4, further comprising a repair data generation circuit block associated with the microcontroller, and including a register to store a redundancy vector to be programmed in re-routing cams and the selected paths for programming information, during execution of a cam programming process.

6. The memory device according to claim 4, wherein the micro-controller further comprises first and second pointer generators, and a binary adder connected to a multiplexer; wherein the current address in the address counter is provided to the first pointer generator, and the content of the up/down counter is provided to the second pointer generator, and the data output by the first and second pointer generators is combined by the binary adder and coupled to a first input of the multiplexer, a second input of the multiplexer receiving an address of a cache memory location through the test mode command interface, for the selection of an access mode.

7. The memory device according to claim 6, wherein the micro-controller further comprises a program counter and an associated read only memory; and wherein the second cache memory is addressable through the program counter which provides pointer data to a third input of the multiplexer.

8. A method of making a memory device comprising:
   providing a flash memory array and an associated micro-controller; and
   providing a test mode command interface for coupling the micro-controller with external test equipment;
   the micro-controller comprising
      a first cache memory for storing column addresses of detected failed cells,
      an address counter associated with the first cache memory,
      an expected data generation circuit for generating expected data,
      a data comparison circuit for comparing the generated expected data with data read from a certain memory location pre-programmed with the expected data,
      a local data cache connected to the data comparison circuit for storing information relative to bits on which a failure has occurred,
      a bit position counter for bit by bit scanning of the local data cache,
      a second cache memory for storing information relative to detected failed array cells,
      an up/down counter for pointing to a location of the local data cache, to a location of the first cache memory and to a location of the second cache memory and including a latch for preserving a pointer value,
      a cache address generator for generating a current address of the second cache memory based upon a current address in the address counter and the up/down counter, and
      a plurality of drivers for accessing the second cache memory for writing therein the following information
         the content of the up/down counter,
         information of the position of the detected failed array cells from the local data cache and the bit position counter,
         the column address of columns with detected failed array cells, and
         test control information.

9. The method according to claim 8, further comprising providing a repair data generation circuit block associated with the microcontroller, and including a register to store a redundancy vector to be programmed in re-routing cams and the selected paths for programming information, during execution of a cam programming process.

10. The method according to claim 8, wherein the micro-controller further comprises first and second pointer generators, and a binary adder connected to a multiplexer; wherein the current address in the address counter is provided to the first pointer generator, and the content of the up/down counter is provided to the second pointer generator, and the data output by the first and second pointer generators is combined by the binary adder and coupled to a first input of the multiplexer, a second input of the multiplexer receiving an address of a cache memory location through the test mode command interface, for the selection of an access mode.

11. The method according to claim 10, wherein the micro-controller further comprises a program counter and an associated read only memory; and wherein the second cache memory is addressable through the program counter which provides pointer data to a third input of the multiplexer.

* * * * *

UNITED STATES PATENT AND TRADEMARK OFFICE
CERTIFICATE OF CORRECTION

PATENT NO. : 7,050,343 B2
APPLICATION NO. : 10/789443
DATED : May 23, 2006
INVENTOR(S) : Promod Kumar et al.

It is certified that error appears in the above-identified patent and that said Letters Patent is hereby corrected as shown below:

| | |
|---|---|
| Column 1, Line 67 | Delete: "failures"<br>Insert: -- failure -- |
| Column 2, Line 32 | Delete: "to the"<br>Insert: -- on the -- |
| Column 4, Line 59 | Delete: "relatives"<br>Insert: -- relative -- |
| Column 4, Line 62 | Delete: "register"<br>Insert: -- registers -- |
| Column 4, Lines 66-67 | Delete: "in which preserve"<br>Insert: -- which preserves -- |
| Column 5, Line 50 | Delete: "at the time"<br>Insert: -- at a time -- |
| Column 7, Line 14 | Delete: "contains"<br>Insert: -- contained -- |
| Column 7, Line 16 | Delete: "occurs"<br>Insert: -- occurred -- |
| Column 7, Line 44 | Delete: "of the all"<br>Insert: -- of all -- |
| Column 7, Line 55 | Delete: "are"<br>Insert: -- is -- |
| Column 7, Line 62 | Delete: "identify"<br>Insert: -- identifying -- |
| Column 8, Line 12 | Delete: "occupy"<br>Insert: -- occupying -- |

UNITED STATES PATENT AND TRADEMARK OFFICE
CERTIFICATE OF CORRECTION

PATENT NO. : 7,050,343 B2
APPLICATION NO. : 10/789443
DATED : May 23, 2006
INVENTOR(S) : Promod Kumar et al.

It is certified that error appears in the above-identified patent and that said Letters Patent is hereby corrected as shown below:

| | |
|---|---|
| Column 8, Line 21 | Delete: "two side"<br>Insert: -- two sides -- |
| Column 9, Line 18 | Delete: "to the"<br>Insert: -- than the -- |
| Column 9, Line 39 | Delete: "column"<br>Insert: -- columns -- |
| Column 10, Line 14 | Delete: "erase"<br>Insert: -- Erase -- |
| Column 10, Line 15 | Delete: "read"<br>Insert: -- Read -- |
| Column 10, Line 20 | Delete: "setting"<br>Insert: -- set -- |
| Column 11, Line 13 | Delete: "at beginning"<br>Insert: -- at the beginning -- |
| Column 11, Line 15 | Delete "electronic"<br>Insert: -- Electronic -- |
| Column 11, Line 22 | Delete: "at the time"<br>Insert: -- at a time -- |
| Column 11, Lines 33-34 | Delete: "parametric measurement"<br>Insert: -- Parametric Measurement -- |
| Column 12, Line 34 | Delete: "erase the step"<br>Insert: -- the erase step -- |
| Column 12, Line 60 | Delete: "perform"<br>Insert: -- performs -- |
| Column 13, Line 18 | Delete: "correspond"<br>Insert: -- corresponds -- |

UNITED STATES PATENT AND TRADEMARK OFFICE
CERTIFICATE OF CORRECTION

PATENT NO.      : 7,050,343 B2
APPLICATION NO. : 10/789443
DATED           : May 23, 2006
INVENTOR(S)     : Promod Kumar et al.

It is certified that error appears in the above-identified patent and that said Letters Patent is hereby corrected as shown below:

| | |
|---|---|
| Column 13, Line 22 | Delete: "catch"<br>Insert: -- Cache -- |
| Column 13, Line 64 | Delete: "vgmin/vgmax"<br>Insert: --Vgmin/Vgmax-- |
| Column 14, Line 2 | Delete: "vgmax/vgmin"<br>Insert: -- Vgmax/Vgmin -- |
| Column 14, Line 26 | Delete: "vgmax/vgmin"<br>Insert: -- Vgmax/Vgmin -- |
| Column 14, Line 28 | Delete: "vgmax/vgmin"<br>Insert: -- Vgmax/Vgmin -- |
| Column 14, Line 30 | Delete: "for vgmax"<br>Insert -- for Vgmax -- |
| Column 14, Line 31 | Delete: "for vgmin"<br>Insert: --for Vgmin -- |
| Column 14, Line 45 | Delete: "vgmax or vgmin"<br>Insert: -- vgmax or Vgmin -- |
| Column 14, Lines 65 and 66 | Delete: "vgmax"<br>Insert: -- Vgmax --<br>Delete: "vgmin"<br>Insert: -- Vgmin -- |
| Column 15, Line 16 | Delete: " all0/all1"<br>Insert: -- All0/All1 -- |
| Column 16, Line (second column) | Delete: "standard"<br>Insert: -- invention -- |
| Column 16, Line 26 | Delete: "ck, ckn, all0/all1"<br>Insert: -- CK, CKN, All0/Aill1 -- |
| Column 16, Line 28 | Delete: "ckn"<br>Insert: -- CKN -- |

UNITED STATES PATENT AND TRADEMARK OFFICE
CERTIFICATE OF CORRECTION

PATENT NO. : 7,050,343 B2
APPLICATION NO. : 10/789443
DATED : May 23, 2006
INVENTOR(S) : Promod Kumar et al.

It is certified that error appears in the above-identified patent and that said Letters Patent is hereby corrected as shown below:

| | |
|---|---|
| Column 16, Lines 29 and 30 | Delete: "ck"<br>Insert: -- CK -- |
| Column 16, Line 33 | Delete: "Ck/Ckn"<br>Insert: -- CK/CKN -- |
| Column 16, Line 42 | Delete: "all0/all1"<br>Insert: -- All0/Ail1 -- |
| Column 16, Line 60 | Delete: "both"<br>Insert: -- by -- |
| Column 17, Line 13 | Delete: "numerosity"<br>Insert: -- number -- |
| Column 17, Line 23 | Delete: "an built-in"<br>Insert: -- a built-in -- |
| Column 17, Line 42 | Delete: "of the time"<br>Insert: -- as the time -- |
| Column 19, Line 47<br>Column 20, Line 46 | Delete: "microcontroller"<br>Insert: -- micro-controller -- |

Signed and Sealed this

Fifth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 7,050,343 B2
APPLICATION NO. : 10/789443
DATED : May 23, 2006
INVENTOR(S) : Promod Kumar et al.

It is certified that error appears in the above-identified patent and that said Letters Patent is hereby corrected as shown below:

| | |
|---|---|
| Column 1, Line 67 | Delete: "failures"<br>Insert: -- failure -- |
| Column 2, Line 32 | Delete: "to the"<br>Insert: -- on the -- |
| Column 4, Line 59 | Delete: "relatives"<br>Insert: -- relative -- |
| Column 4, Line 62 | Delete: "register"<br>Insert: -- registers -- |
| Column 4, Lines 66-67 | Delete: "in which preserve"<br>Insert: -- which preserves -- |
| Column 5, Line 50 | Delete: "at the time"<br>Insert: -- at a time -- |
| Column 7, Line 14 | Delete: "contains"<br>Insert: -- contained -- |
| Column 7, Line 16 | Delete: "occurs"<br>Insert: -- occurred -- |
| Column 7, Line 44 | Delete: "of the all"<br>Insert: -- of all -- |
| Column 7, Line 55 | Delete: "are"<br>Insert: -- is -- |
| Column 7, Line 62 | Delete: "identify"<br>Insert: -- identifying -- |
| Column 8, Line 12 | Delete: "occupy"<br>Insert: -- occupying -- |

UNITED STATES PATENT AND TRADEMARK OFFICE
CERTIFICATE OF CORRECTION

PATENT NO. : 7,050,343 B2
APPLICATION NO. : 10/789443
DATED : May 23, 2006
INVENTOR(S) : Promod Kumar et al.

It is certified that error appears in the above-identified patent and that said Letters Patent is hereby corrected as shown below:

| | |
|---|---|
| Column 8, Line 21 | Delete: "two side" <br> Insert: -- two sides -- |
| Column 9, Line 18 | Delete: "to the" <br> Insert: -- than the -- |
| Column 9, Line 39 | Delete: "column" <br> Insert: -- columns -- |
| Column 10, Line 14 | Delete: "erase" <br> Insert: -- Erase -- |
| Column 10, Line 15 | Delete: "read" <br> Insert: -- Read -- |
| Column 10, Line 20 | Delete: "setting" <br> Insert: -- set -- |
| Column 11, Line 13 | Delete: "at beginning" <br> Insert: -- at the beginning -- |
| Column 11, Line 15 | Delete "electronic" <br> Insert: -- Electronic -- |
| Column 11, Line 22 | Delete: "at the time" <br> Insert: -- at a time -- |
| Column 11, Lines 33-34 | Delete: "parametric measurement" <br> Insert: -- Parametric Measurement -- |
| Column 12, Line 34 | Delete: "erase the step" <br> Insert: -- the erase step -- |
| Column 12, Line 60 | Delete: "perform" <br> Insert: -- performs -- |
| Column 13, Line 18 | Delete: "correspond" <br> Insert: -- corresponds -- |

UNITED STATES PATENT AND TRADEMARK OFFICE
CERTIFICATE OF CORRECTION

PATENT NO. : 7,050,343 B2
APPLICATION NO. : 10/789443
DATED : May 23, 2006
INVENTOR(S) : Promod Kumar et al.

It is certified that error appears in the above-identified patent and that said Letters Patent is hereby corrected as shown below:

| | |
|---|---|
| Column 13, Line 22 | Delete: "catch"<br>Insert: -- Cache -- |
| Column 13, Line 64 | Delete: "vgmin/vgmax"<br>Insert: --Vgmin/Vgmax-- |
| Column 14, Line 2 | Delete: "vgmax/vgmin"<br>Insert: -- Vgmax/Vgmin -- |
| Column 14, Line 26 | Delete: "vgmax/vgmin"<br>Insert: -- Vgmax/Vgmin -- |
| Column 14, Line 28 | Delete: "vgmax/vgmin"<br>Insert: -- Vgmax/Vgmin -- |
| Column 14, Line 30 | Delete: "for vgmax"<br>Insert -- for Vgmax -- |
| Column 14, Line 31 | Delete: "for vgmin"<br>Insert: --for Vgmin -- |
| Column 14, Line 45 | Delete: "vgmax or vgmin"<br>Insert: -- Vgmax or Vgmin -- |
| Column 14, Lines 65 and 66 | Delete: "vgmax"<br>Insert: -- Vgmax --<br>Delete: "vgmin"<br>Insert: -- Vgmin -- |
| Column 15, Line 16 | Delete: " all0/all1"<br>Insert: -- All0/All1 -- |
| Column 16, Line (second column) | Delete: "standard"<br>Insert: -- invention -- |
| Column 16, Line 26 | Delete: "ck, ckn, all0/all1"<br>Insert: -- CK, CKN, All0/Alll1 -- |
| Column 16, Line 28 | Delete: "ckn"<br>Insert: -- CKN -- |

UNITED STATES PATENT AND TRADEMARK OFFICE
CERTIFICATE OF CORRECTION

PATENT NO. : 7,050,343 B2
APPLICATION NO. : 10/789443
DATED : May 23, 2006
INVENTOR(S) : Promod Kumar et al.

It is certified that error appears in the above-identified patent and that said Letters Patent is hereby corrected as shown below:

| | |
|---|---|
| Column 16, Lines 29 and 30 | Delete: "ck"<br>Insert: -- CK -- |
| Column 16, Line 33 | Delete: "Ck/Ckn"<br>Insert: -- CK/CKN -- |
| Column 16, Line 42 | Delete: "all0/all1"<br>Insert: -- All0/All1 -- |
| Column 16, Line 60 | Delete: "both"<br>Insert: -- by -- |
| Column 17, Line 13 | Delete: "numerosity"<br>Insert: -- number -- |
| Column 17, Line 23 | Delete: "an built-in"<br>Insert: -- a built-in -- |
| Column 17, Line 42 | Delete: "of the time"<br>Insert: -- as the time -- |
| Column 19, Line 47<br>Column 20, Line 46 | Delete: "microcontroller"<br>Insert: -- micro-controller -- |

This certificate supersedes Certificate of Correction issued December 5, 2006.

Signed and Sealed this

Twenty-second Day of May, 2007

JON W. DUDAS
*Director of the United States Patent and Trademark Office*